(12) United States Patent
Nakazawa

(10) Patent No.: US 9,349,638 B2
(45) Date of Patent: May 24, 2016

(54) MEMORY DEVICE

(71) Applicant: Takashi Nakazawa, Gyeonggi-do (KR)

(72) Inventor: Takashi Nakazawa, Gyeonggi-do (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/174,598

(22) Filed: Feb. 6, 2014

(65) Prior Publication Data

US 2015/0061025 A1 Mar. 5, 2015

Related U.S. Application Data

(60) Provisional application No. 61/872,264, filed on Aug. 30, 2013.

(51) Int. Cl.
| | |
|---|---|
| *H01L 27/22* | (2006.01) |
| *H01L 21/768* | (2006.01) |
| *H01L 27/24* | (2006.01) |
| *H01L 27/02* | (2006.01) |

(52) U.S. Cl.
CPC .... *H01L 21/76877* (2013.01); *H01L 21/76802* (2013.01); *H01L 27/228* (2013.01); *H01L 27/2436* (2013.01); *H01L 27/0207* (2013.01)

(58) Field of Classification Search
CPC ............ H01L 23/535; H01L 21/76877; H01L 21/76802; H01L 21/1052; H01L 27/228; H01L 27/2436; H01L 29/7831; H01L 29/66484; H01L 43/08
See application file for complete search history.

(56) References Cited

U.S. PATENT DOCUMENTS

| | | | |
|---|---|---|---|
| 7,948,784 B2 | 5/2011 | Kajigaya | |
| 8,164,147 B2 | 4/2012 | Asao | |
| 8,395,933 B2 | 3/2013 | Inaba | |
| 2008/0308887 A1* | 12/2008 | Asao et al. ..................... | 257/421 |
| 2010/0103718 A1* | 4/2010 | Asao et al. ..................... | 365/148 |
| 2010/0214833 A1* | 8/2010 | Takemura et al. ............. | 365/163 |
| 2010/0237321 A1* | 9/2010 | Inaba ................................ | 257/5 |
| 2011/0205777 A1 | 8/2011 | Kajigaya | |
| 2012/0008367 A1* | 1/2012 | Kajiyama ...................... | 365/148 |
| 2012/0228685 A1* | 9/2012 | Kim .............................. | 257/295 |
| 2013/0148420 A1 | 6/2013 | Inaba | |
| 2014/0021551 A1* | 1/2014 | Nam et al. ..................... | 257/365 |
| 2014/0124726 A1* | 5/2014 | Oh ..................................... | 257/4 |
| 2014/0131786 A1* | 5/2014 | Ryu et al. ...................... | 257/316 |
| 2014/0254239 A1* | 9/2014 | Song et al. ..................... | 365/148 |
| 2014/0256103 A1* | 9/2014 | Kim ............................... | 438/270 |
| 2014/0284533 A1* | 9/2014 | Asao et al. ........................ | 257/1 |
| 2014/0284738 A1* | 9/2014 | Nakazawa et al. ............ | 257/421 |
| 2014/0286085 A1* | 9/2014 | Miyakawa .................... | 365/158 |
| 2014/0306277 A1* | 10/2014 | Asao .............................. | 257/295 |

\* cited by examiner

*Primary Examiner* — Jarrett Stark
*Assistant Examiner* — Bitew Dinke
(74) *Attorney, Agent, or Firm* — Holtz, Holtz & Volek PC

(57) ABSTRACT

A memory device according to embodiments includes a cell array region. The cell array region comprises a plurality of transistors sharing a word line, a plurality of memory elements, and a plurality of first contacts configured to connect the plurality of transistors with the plurality of memory elements, respectively, and aligned with a pitch. The memory device further comprises a second contact positioned at the pitch, along an extension of a row of the plurality of first contacts, outside the cell array region, and configured to be in contact with the word line.

11 Claims, 24 Drawing Sheets

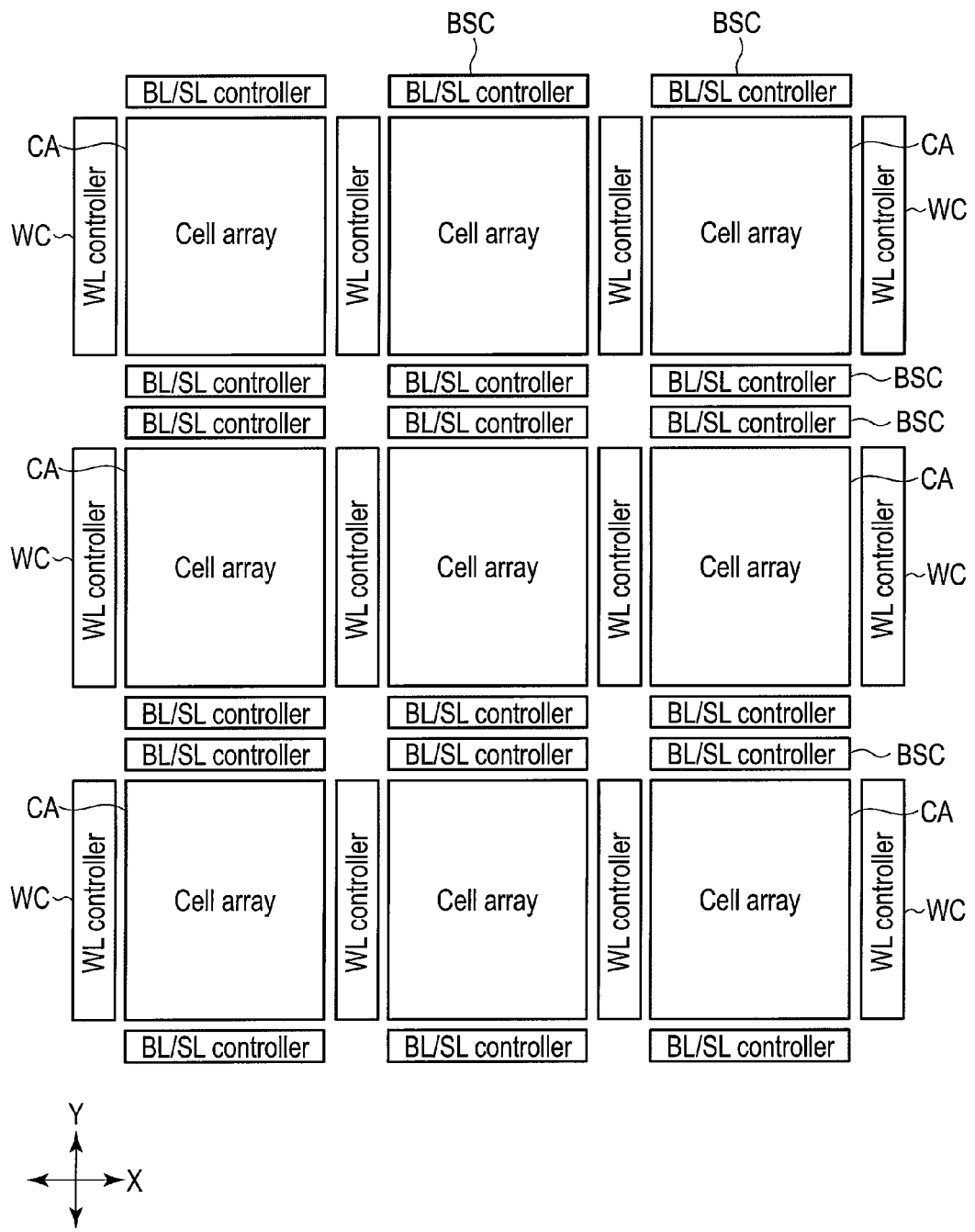
F I G. 1

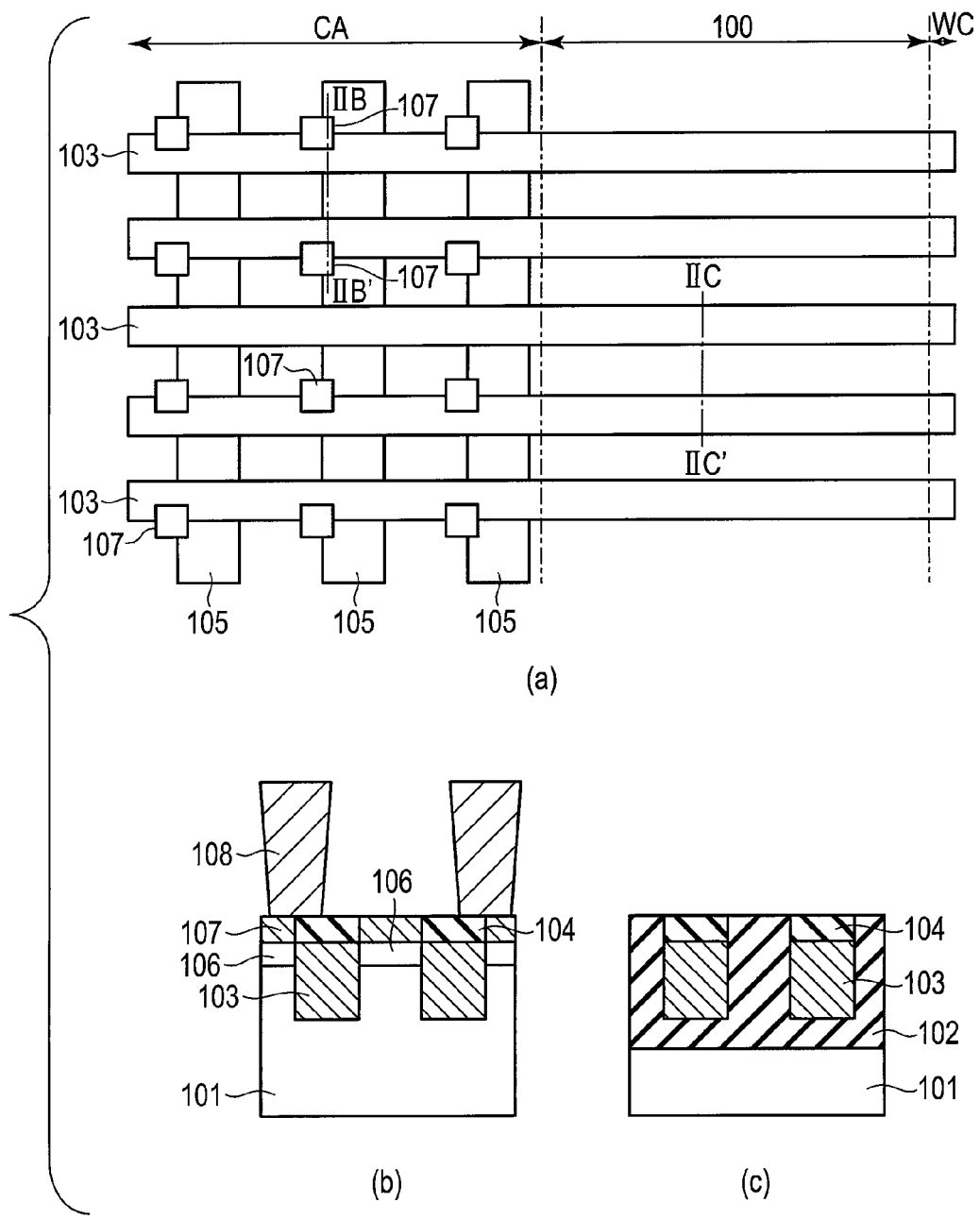
F I G. 2

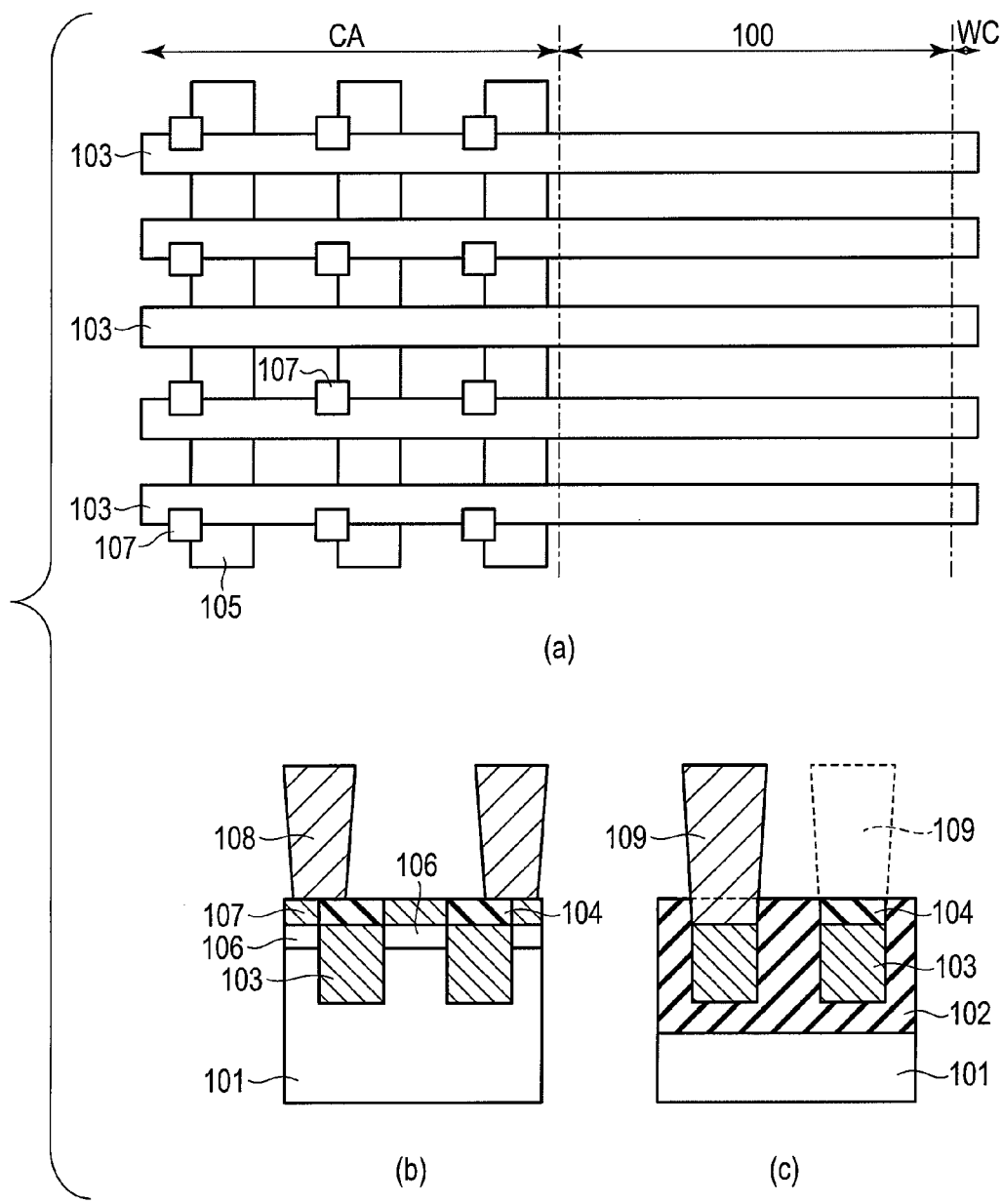
F I G. 3

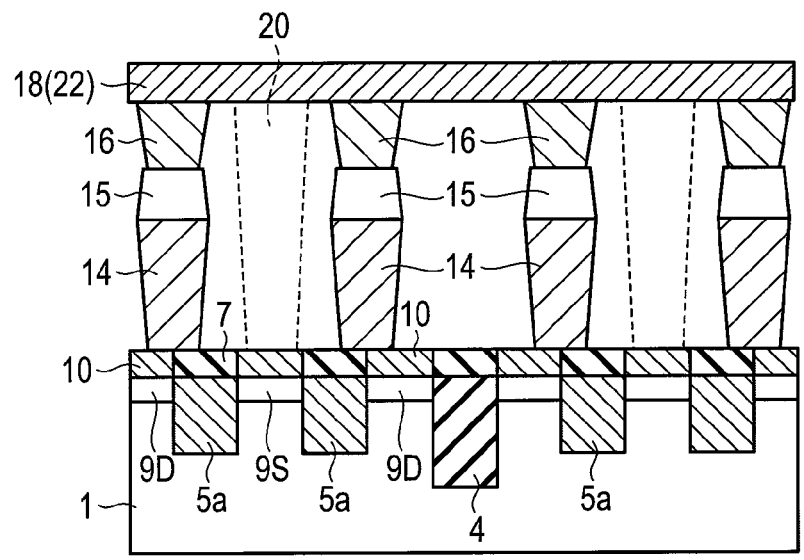
F I G. 6
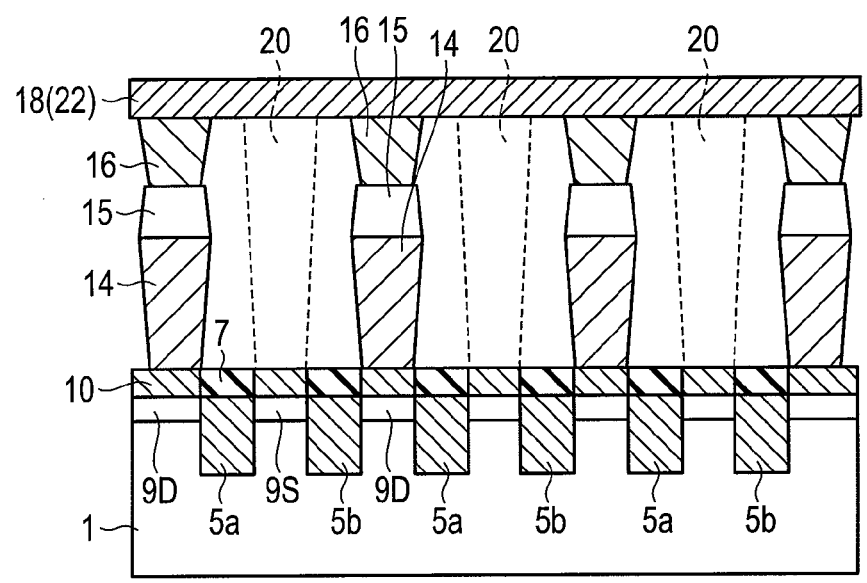
F I G. 7

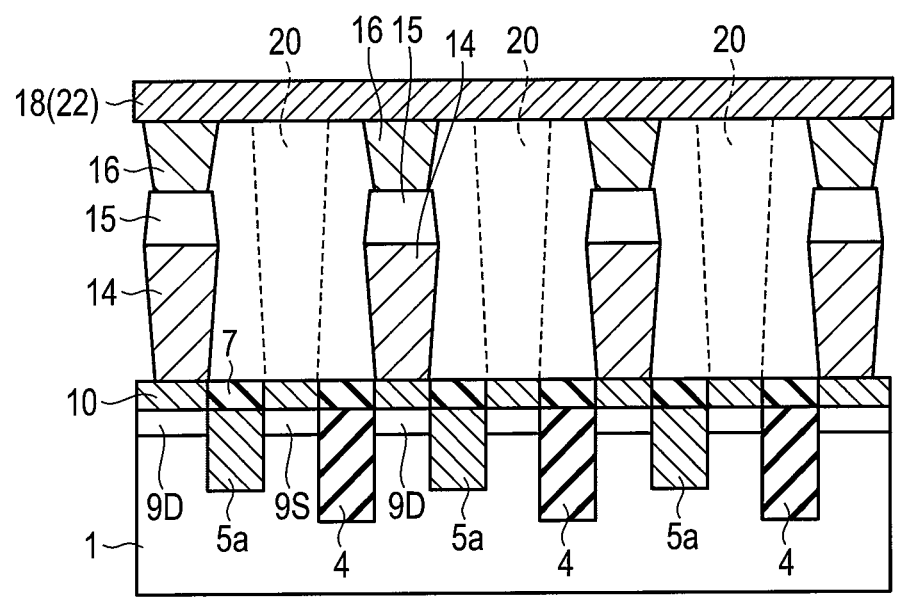
F I G. 8

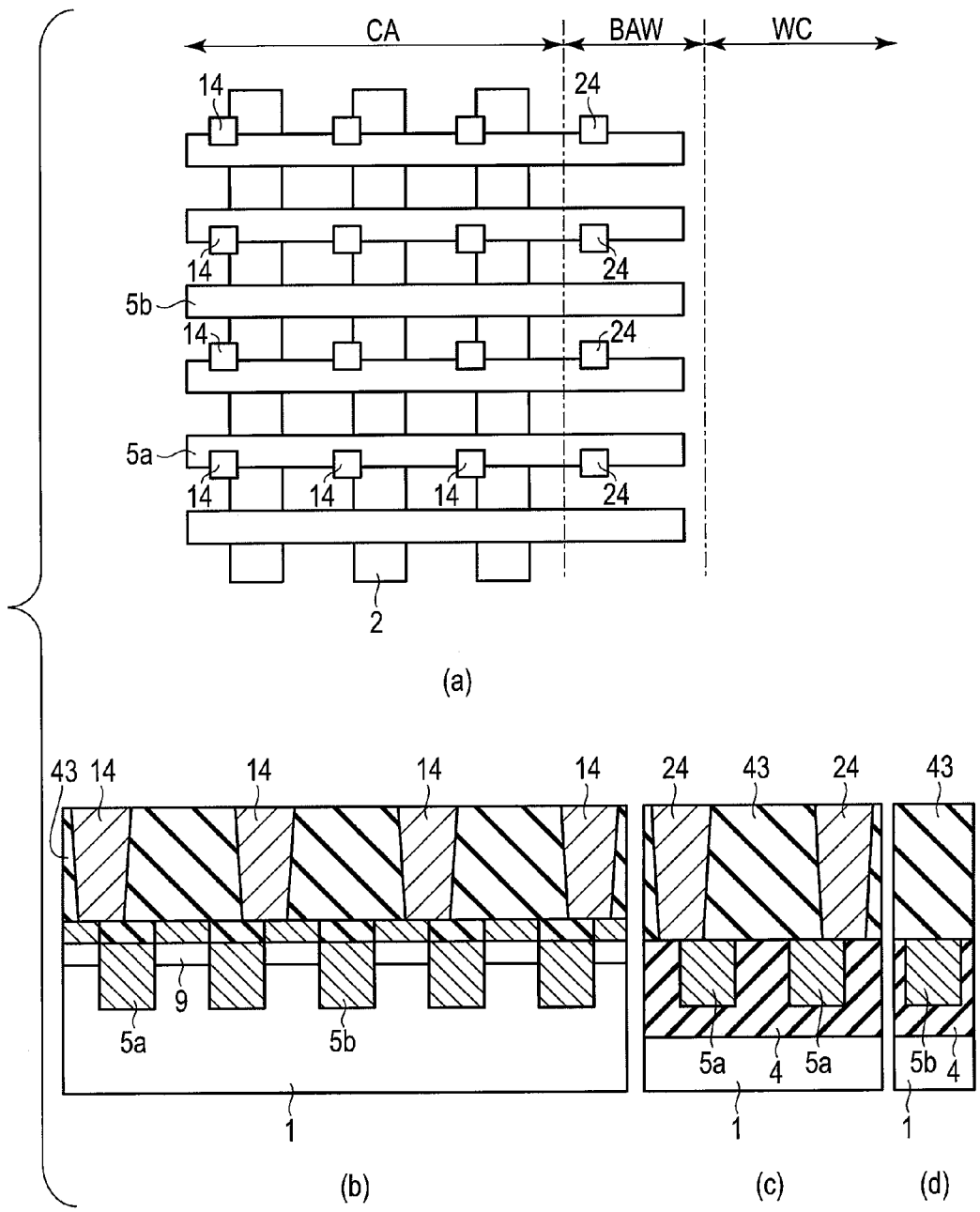
F I G. 12

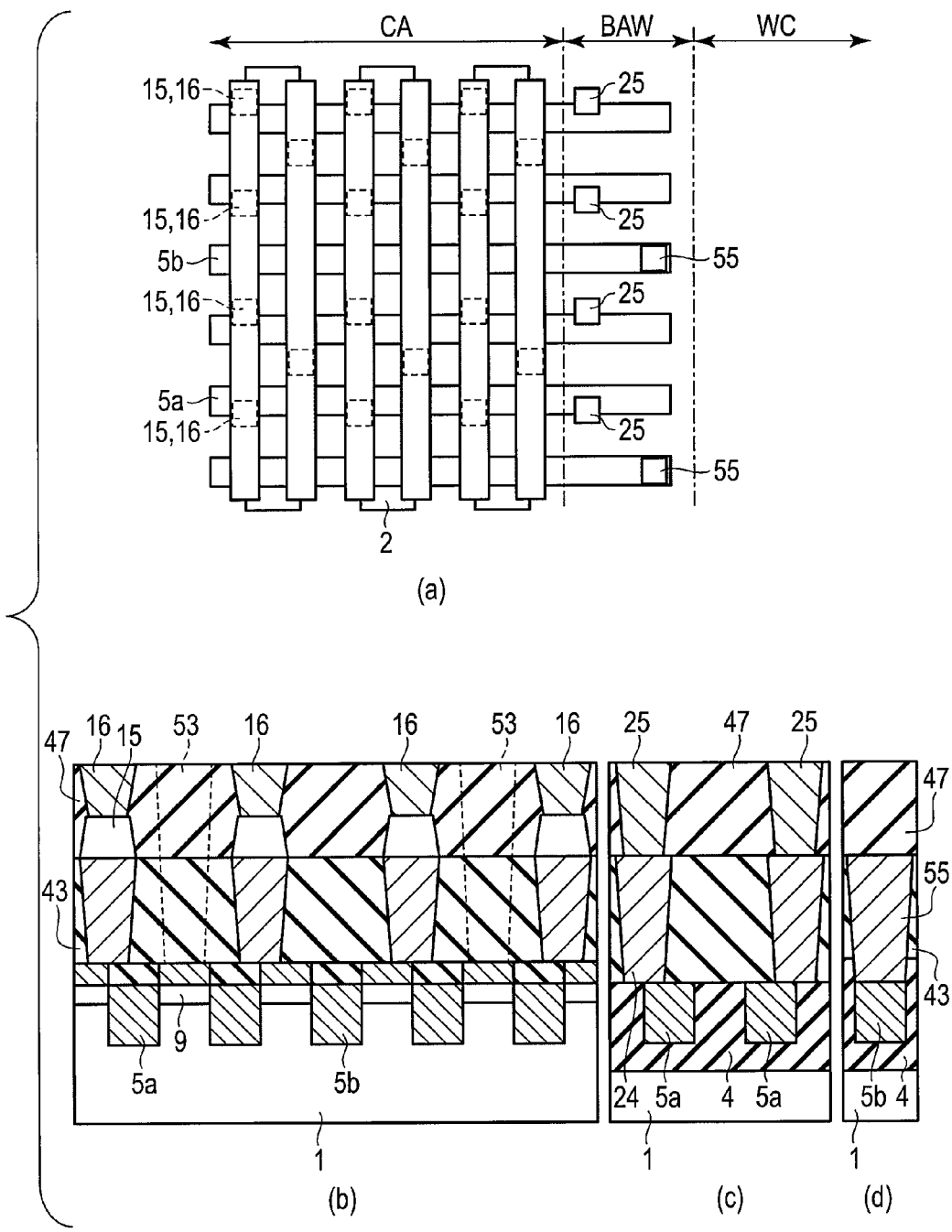
F I G. 18

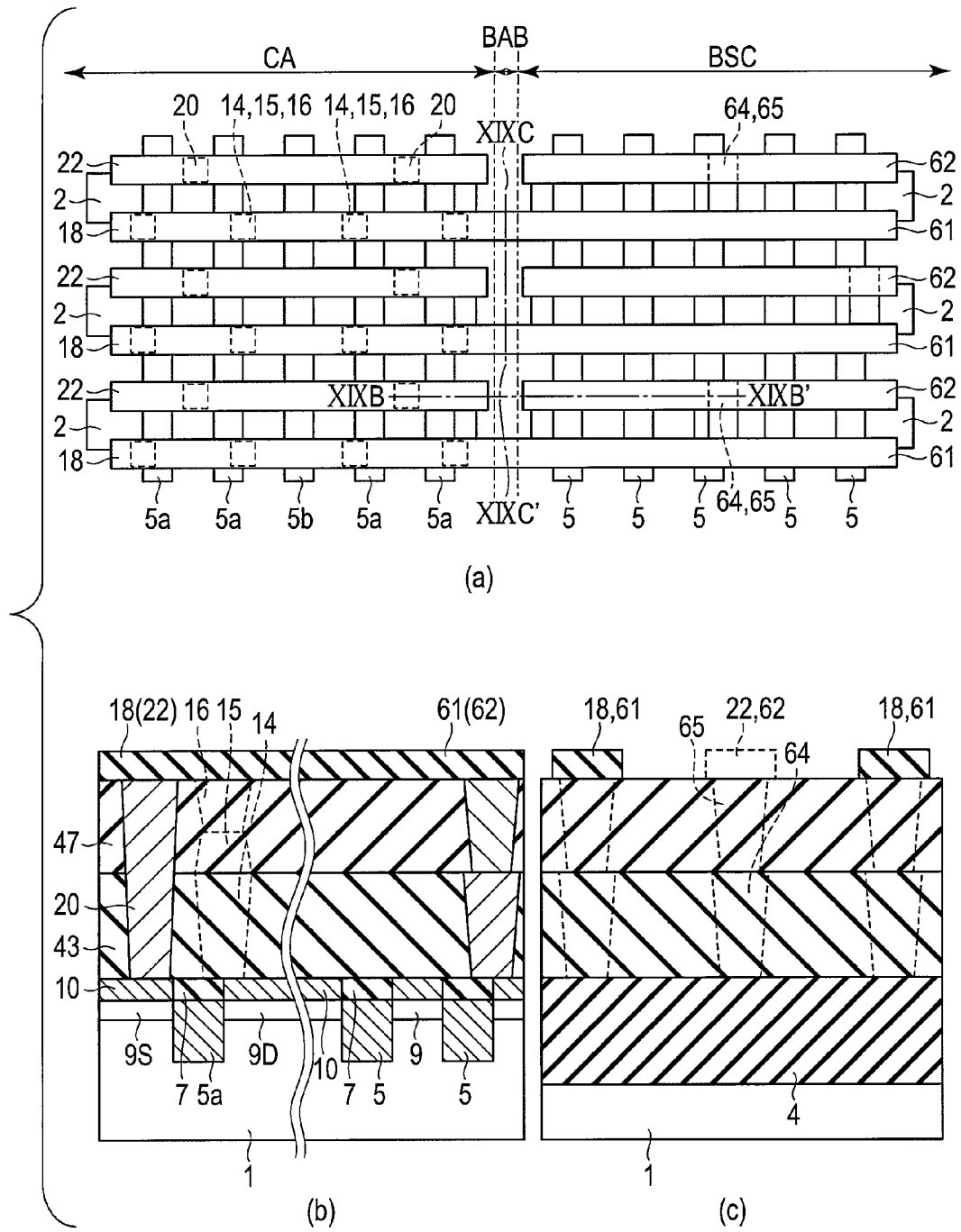
F I G. 19

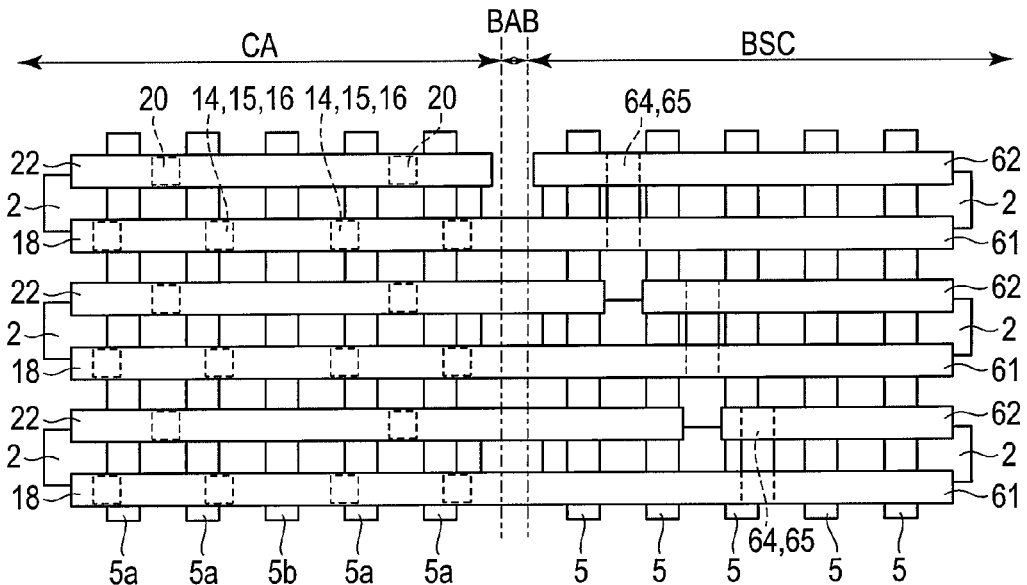
F I G. 22
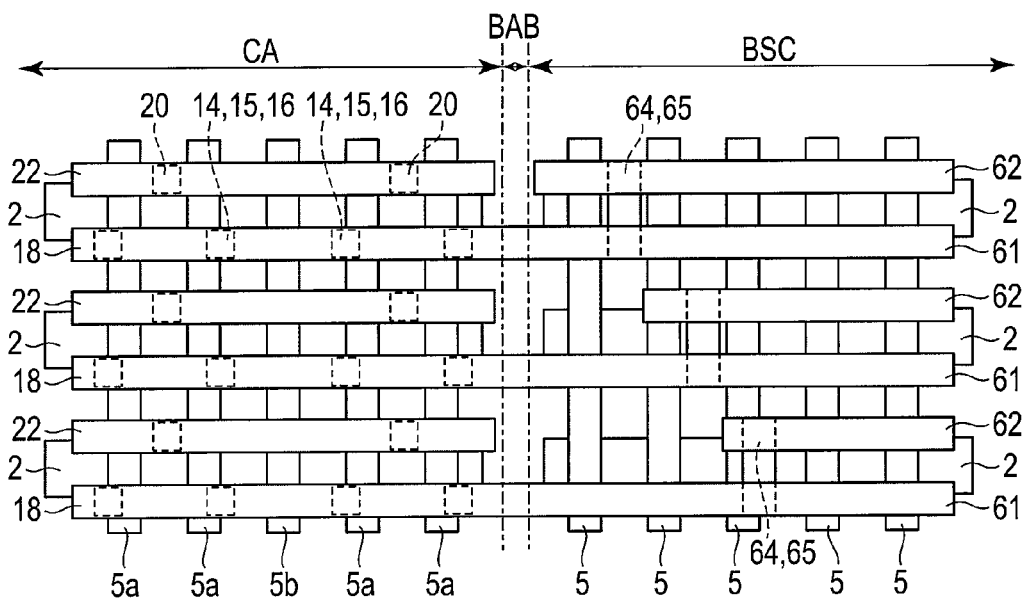
F I G. 23

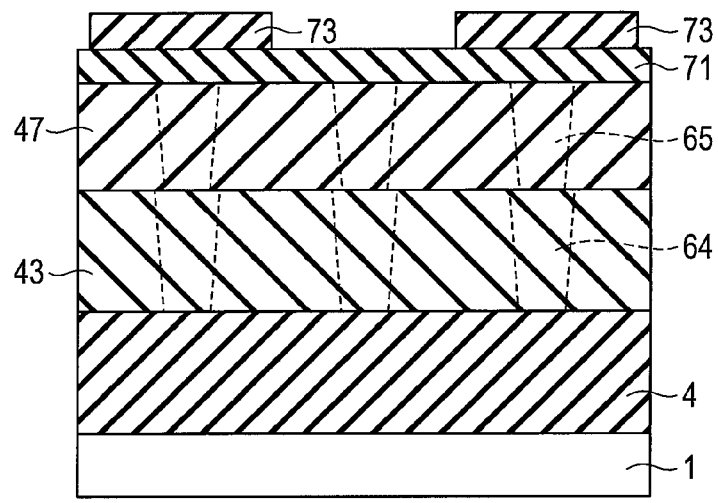
F I G. 26
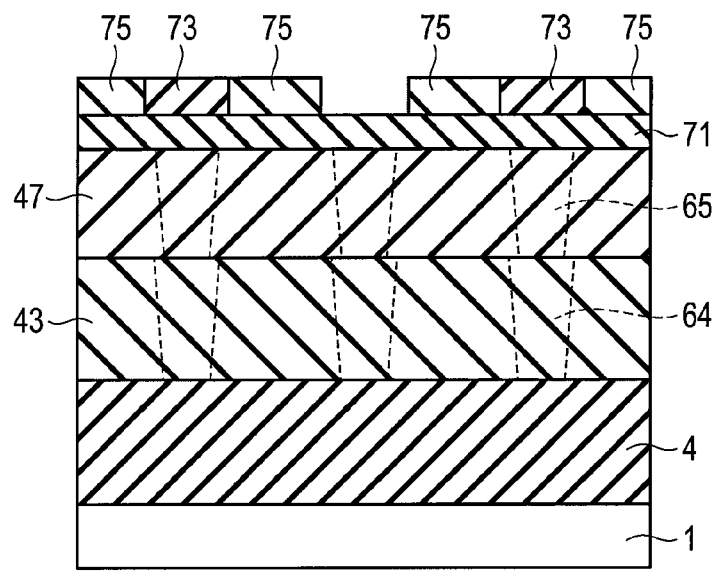
F I G. 27

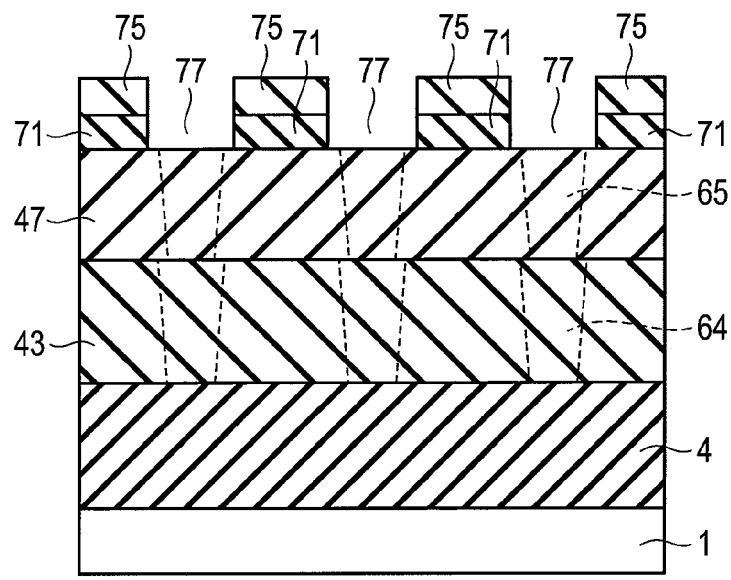
F I G. 28
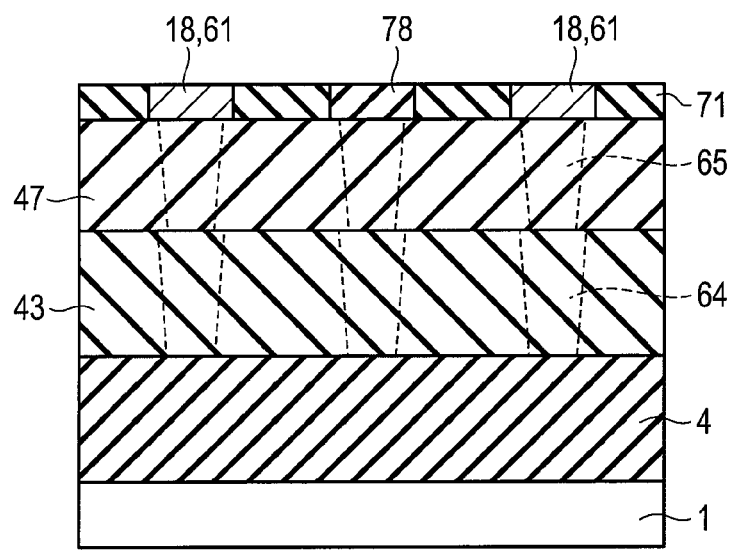
F I G. 29

MEMORY DEVICE

CROSS-REFERENCE TO RELATED APPLICATIONS

This application claims the benefit of U.S. Provisional Application No. 61/872,264, filed Aug. 30, 2013, the entire contents of which are incorporated herein by reference.

FIELD

Embodiments described herein relate generally to a memory device.

BACKGROUND

A memory cell array and a cell called a core circuit, a peripheral circuit or the like are often provided in a memory device. The core circuit or peripheral circuit controls the memory cell array. Different design rules are frequently applied to the memory cell array and the core circuit or peripheral circuit.

BRIEF DESCRIPTION OF THE DRAWINGS

FIG. 1 shows a layout of a magnetic memory device according to first and second embodiments;

FIG. 2 shows an example of a state in a manufacturing process of the magnetic memory device shown in FIG. 1;

FIG. 3 shows a state subsequent to FIG. 2;

FIG. 6 shows a structure of a part of the magnetic memory device according to a second example of the first embodiment;

FIG. 7 shows a structure of a part of the magnetic memory device according to a second example of the first embodiment;

FIG. 8 shows a structure of a part of the magnetic memory device according to a second example of the first embodiment;

FIG. 12 shows a state subsequent to FIG. 11.

FIG. 18 shows a state subsequent to FIG. 17;

FIG. 19 shows a structure of a part of the magnetic memory device according to the second embodiment;

FIG. 22 shows a structure of a part of the magnetic memory device according to a second example of the second embodiment;

FIG. 23 shows a structure of a part of the magnetic memory device according to a third example of the second embodiment;

FIG. 26 shows a state in a manufacturing process of the second example of the magnetic memory device according to the second embodiment;

FIG. 27 shows a state subsequent to FIG. 26;
FIG. 28 shows a state subsequent to FIG. 27; and
FIG. 29 shows a state subsequent to FIG. 28.

DETAILED DESCRIPTION

Figure 4:
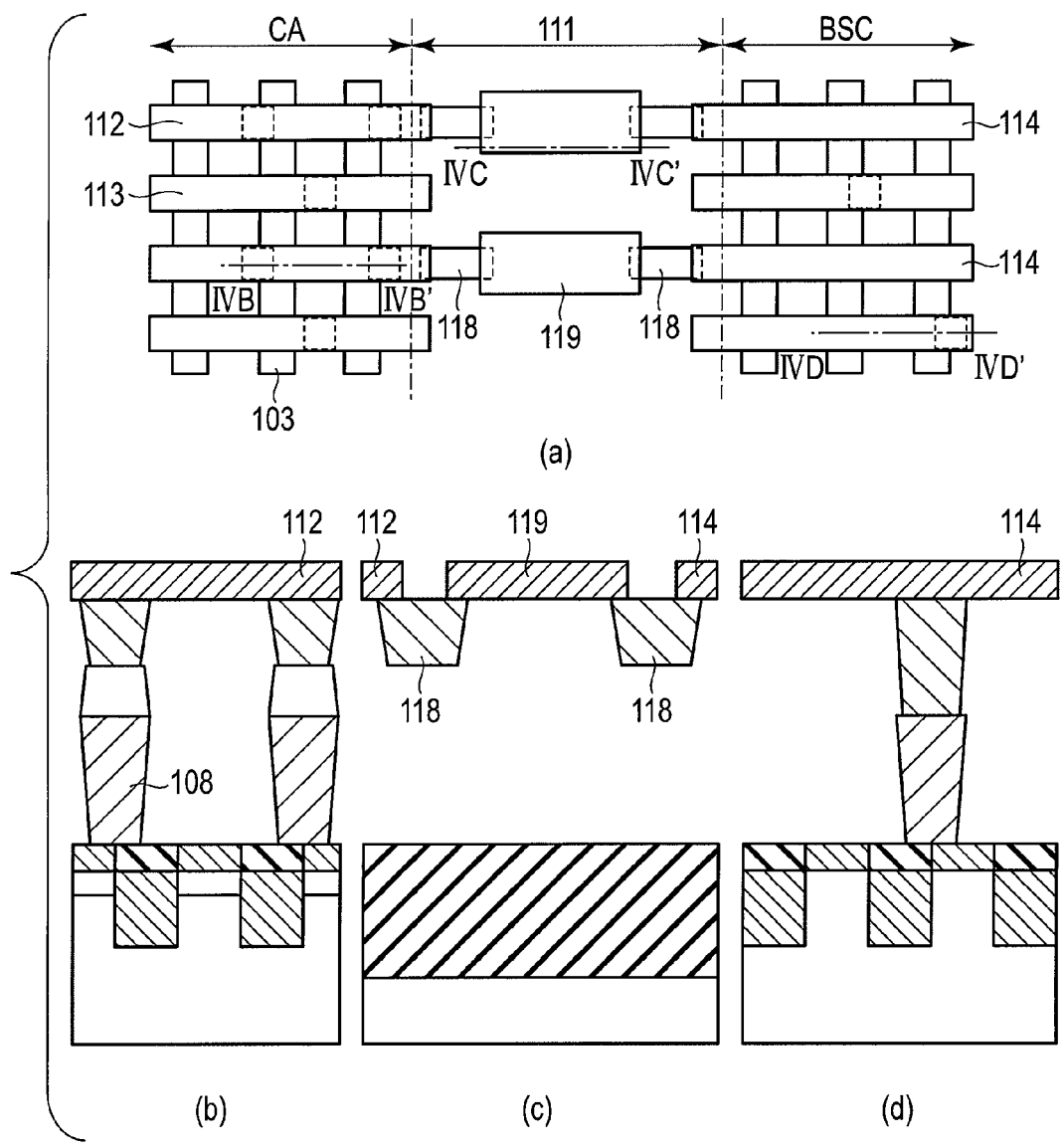
FIG. 4 shows a part of the magnetic memory device shown in FIG. 1.

A memory device according to embodiments comprises a cell array region. The cell array region comprises a plurality of transistors sharing a word line, a plurality of memory elements, and a plurality of first contacts configured to connect the plurality of transistors with the plurality of memory elements, respectively, and aligned with a pitch. The memory device further comprises a second contact positioned with the pitch, along an extension of a row of the plurality of first contacts, outside the cell array region, and configured to be in contact with the word line.

Related technology will be described prior to the descriptions of the embodiments.

FIG. 1 shows an example of a layout of a magnetic memory device (MRAM, magnetoresistive random access memory). As shown in FIG. 1, a plurality of memory cell arrays (cell arrays) CA are arrayed in a matrix. Word line controllers WC are provided between the cell arrays CA aligned in an X-direction. In addition, Bit line/source line controllers BSC are provided along both ends (upper end and lower end) in a Y-direction of each of the cell arrays CA. Two of the bit line/source line controllers BSC aligned along each of the cell arrays CA are used to control the cell array CA. The single word line controller WC is illustrated between the cell arrays CA, in the figure, which suggests that the word line controller WC is shared by two adjacent cell arrays CA. Similarly to the bit line/source line controller BSC, however, the word line controller WC may be exclusive for each of the cell arrays CA. At an intersection of a column in which the word line controllers WC are aligned and a row in which each bit line/source line controller BSC is aligned, no element may be disposed or a core circuit or a peripheral circuit may be disposed.

FIG. 2 and FIG. 3 sequentially show examples of states of the magnetic memory device shown in FIG. 1 in a manufacturing process. A layout of the cell array CA, the word line controller WC and a region 100 of a boundary between the array and the controller is shown in (a) of FIG. 2 and FIG. 3. In each of FIG. 2 and FIG. 3, (b) shows cross sections seen along lines IIB-IIB' and IIC-IIC' in FIG. 2, and (c) shows a cross section seen along line IIC-IIC' in FIG. 2.

As shown in FIG. 2, an element isolating/insulating film 102, a gate insulating film (not shown) and a gate electrode 103, an insulating film 104, a source/drain region 106, and a silicide 107 are formed on a surface of a substrate 101. Next, a contact 108 reaching the silicide 107 is formed by a lithography process and etching, in the cell array CA. Then, as shown in FIG. 3, a contact 109 reaching the gate electrode 103 is formed by a lithographic process and etching, in the boundary region 100. The contact 109 is formed in, for example, the same process as the contact reaching the source/drain region in the word line controller WC.

The contact 109 of the boundary region 100 is formed in a process different from that of the contact 108, after the formation of the contact 108 of the cell array CA, as understood from FIG. 2 and FIG. 3. One of the reasons is that films different in the cell array CA and the boundary region 100 are subjected to the etching for formation of contact holes for the contacts 108 and 109. In other words, the contact 108 of the cell array CA needs to maintain the insulating film 104 between the contact 108 and the gate electrode 103 while the contact 109 of the boundary region 100 needs to reach the gate electrode 103 through the insulating film 104. The formation of the contacts 108 and 109 in the different processes requires a mask arrangement and an etching step for each of the contact formation processes. When the different processes for contact hole formation including the mask arrangement are thus executed in different regions, a sufficient distance is generally set between the regions. This results from setting a mask opening to be slightly large, etc., such that the hole can be formed above the already formed element even if a mask position is displaced from an original position. In addition, the boundary region 100 is large such that the formation process of the contact 109 gives no influences to the already formed contact 108 even if the mask position is displaced since the contact 109 is formed after the formation of the contact 108. However, the boundary region 100 is useless for the element arrangement. Since a number of boundary regions 100 are included in the magnetic memory device as understood from FIG. 1, a total area of unnecessary boundary regions 100 is large even if a single boundary region 100 is small. More magnetic memory device chips need to be manufactured from a wafer in order to reduce manufacturing costs of the magnetic memory device, but the boundary regions 100 deny this request.

Similarly to this, it is preferable that an area of a boundary between the cell array CA and the bit line/source line controller BSC is also small. FIG. 4 shows a layout and a cross section of the cell array CA and the bit line/source line controller BSC shown in FIG. 1, and a region 111 of the boundary between the array and the controller. In FIG. 4, (a) illustrates the layout, and (b), (c) and (d) illustrate cross sections seen along lines IVB-IVB', IVC-IVC' and IVD-IVD' in (a), respectively. Some patterns of an M0 interconnect layer are formed at a minimum pitch, in the cell array CA and the bit line/source line controller BSC. In the cell array CA, a bit line 112 and a source line 113 are formed at the minimum pitch in the M0 interconnect layer. The bit line 112 needs to be electrically connected with the interconnect 114 of the minimum pitch extending from the bit line/source line controller BSC, at one of sides of the cell array CA, and the source line 113 needs to be electrically connected with the interconnect 114 of the minimum pitch extending from the bit line/source line controller BSC, at the other side of the cell array CA.

The bit line 112 and the source line 113 are often formed by double patterning such as sidewall patterning technology (SPT) since they are formed at the minimum pitch. The SPT enables formation of a pattern and a pitch smaller than the pattern and the pitch of the limit that can be formed by one-time photolithography process. However, the length of each pattern cannot be adjusted separately by the SPT. For this reason, the bit line 112 or the source line 113, and the interconnect 114 cannot be formed in the single M0 interconnect layer pattern extending from the cell array CA to the bit line/source line controller BSC. Thus, the structure as shown in FIG. 4 is employed to electrically connect the bit line 112 or the source line 113 with the interconnect 114.

A bottom surface of the bit line 112 is connected with an interconnect 118, and a top surface of the interconnect 118 is connected with an interconnect 119, as shown in FIG. 4. The interconnect 119 is connected with the interconnect 114 via another interconnect 118. Similarly, the source line 113 is also connected with another interconnect 114, in a region different from the region shown in FIG. 4. The interconnect 119 is formed in a general (non-SPT) lithographic process. Such a connection between the bit line 112 or the source line 113 and the interconnect 114 requires a region for the interconnects 118 and 119, and a space for the formation, and the large boundary region 111 is therefore required. Of course, this matter prevents the manufacturing costs of the magnetic memory device from being lowered. In addition, the SPT comprises inevitably forming a pattern for connecting terminations of two line patterns, and forming an independent line pattern excluding the connection pattern (loop pattern) (i.e., loop-cut). When the bit line 112, the source line 113 and the interconnect 114 are formed by the SPT, the loop-cut is required on both of the cell array CA side and the bit line/source line controller BSC side, in the boundary region 111. The loop-cut requires a margin of the boundary region 110, which increases the area of the boundary region 110.

Embodiments will be described below with reference to the accompanying drawings. In the following descriptions, components having substantially the same functions and configurations are denoted by the same reference numbers and symbols, and duplicated descriptions are made as needed. The drawings are illustrations. Each of the embodiments exemplifies an apparatus and a method to implement a technical idea of the embodiment. The technical idea of the embodiment does not specify materials, shapes, structures, arrangements, etc., of components to those described below. The drawings are illustrations and, to clearly show a certain component, the drawings may show the element in different sizes. In addition, to emphasize certain components, etc., the relationship in size between the components may be different from an actual relationship in a certain drawing.

First Embodiment

A layout of a memory device according to a first embodiment is the same as that in FIG. 1. As described above and below, however, a structure of a boundary region between a cell array CA and a word line controller WC is different from the structure described with reference to FIG. 2 and FIG. 3.

Figure 5:
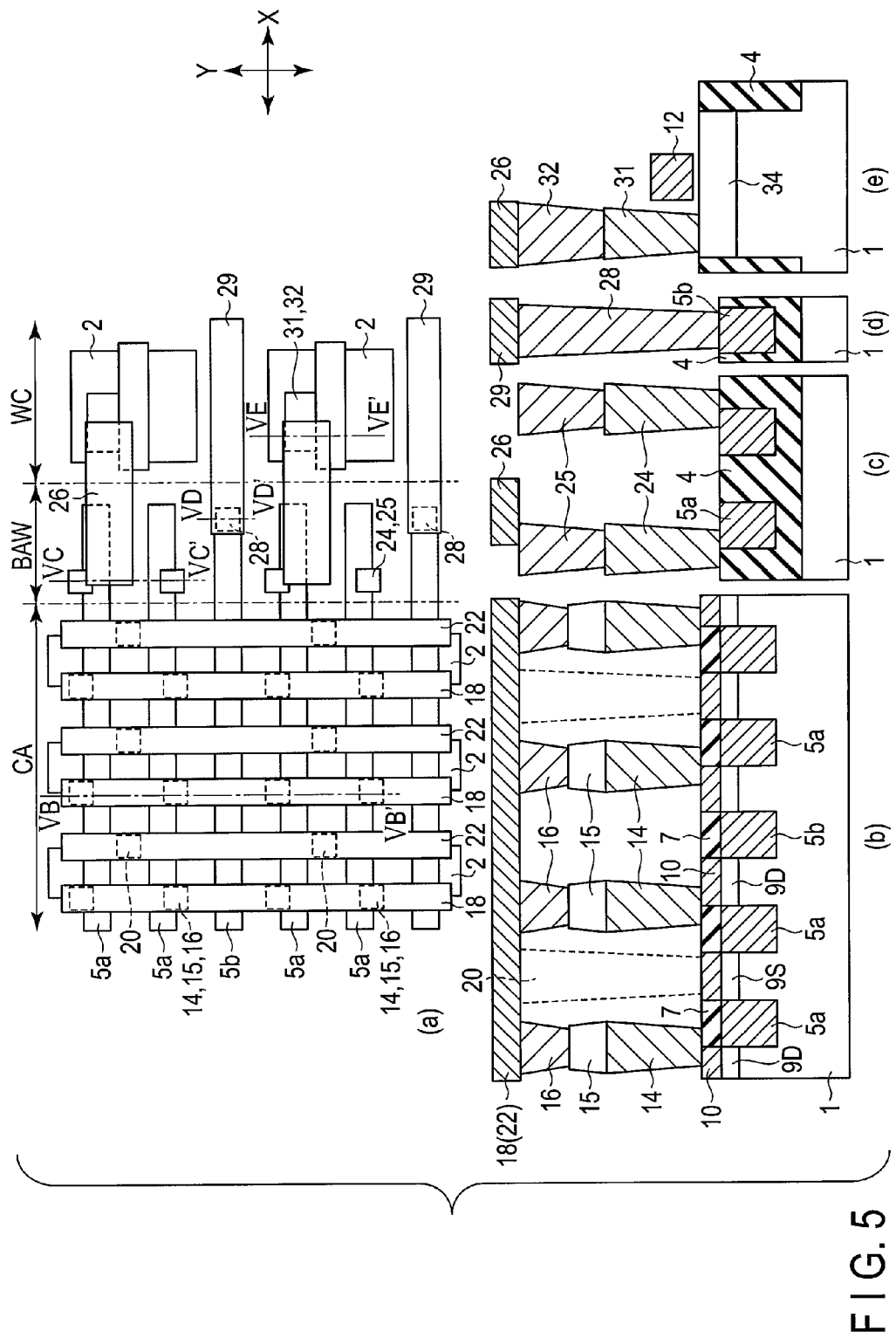
FIG. 5 shows a structure of a part of the magnetic memory device according to the first embodiment.

FIG. 5 shows a structure of a part of the memory device according to the first embodiment, illustrating a region BAW of the boundary between the cell array CA and the word line controller WC, and a periphery of the region. In FIG. 5, (a) illustrates the layout of the boundary region BAW and the periphery of the region, and (b), (c), (d) and (e) illustrate cross sections seen along lines VB-VB', VC-VC', VD-VD' and VE-VE' in (a), respectively.

As shown in FIG. 5, an active region 2 is formed on a surface of a semiconductor substrate 1. In addition, an element isolating/insulating film 4 of a shallow trench isolation (STI) structure is formed on the surface of the substrate 1 in the boundary region BAW and the word line controller WC. The element isolating/insulating film 4 partitions the active region 2. A gate electrode 5 is formed near the surface of the substrate 1, in the active region 2 in the cell array CA. The gate electrode 5 is formed of a conductive material embedded in a trench in the substrate 1 through a gate insulating film (not shown). The gate electrode 5 (5a, 5b) extends in the X-direction. In the cell array CA, an insulating film 7 of, for example, SiN or the like is disposed on the surface of the substrate 1, above the gate electrode 5. The insulating film 7 insulates a contact 14 which will be formed later to be brought into contact with a source/drain region 9 from the gate electrode 5. In the cell array CA, the source/drain region 9 (9S, 9D) is formed on each of both sides of the gate electrode 5. The gate electrode 5 and a pair of source/drain regions 9 on both sides of the electrode constitute a cell transistor. Adjacent cell transistors share the source region 9S. The cell transistors sharing the source region 9S are paired. The gate electrode 5b between the transistor pair has a function of electrically isolating the gate electrode 5a on both sides thereof, is fixed to a specific potential, and does not constitute the cell transistor. The gate electrode 5b is often called an insulating gate electrode. A low-resistance layer 10 such as silicide or a diffusion layer is formed on a surface of the source/drain region 9.

The gate electrode 5 extends from the cell array CA to the boundary region BAW. In regions other than the cell array CA, the gate electrode 5 is formed in the element isolating/insulating film 4. In addition, the insulating film 7 is not formed on at least a part in the boundary region BAW, more specifically, at least the gate electrode 5. The surface of the substrate 1 (i.e., surface of the insulating film 7) is lower than the surface of the substrate 1 (insulating film 7) in the cell array CA to an extent to which the insulating film 7 is not formed as described later. In the boundary region BAW, the insulating film 7 does not exist on at least the gate electrode 5, and the gate electrode 5 is therefore exposed.

The word line controller WC is qualified to control an electric potential of the gate electrode 5. For example, the gate electrodes 5a are alternately pulled out one by one to the right and left sides of the cell array CA. The gate electrodes 5 pulled out to the left side are controlled by the word line controller WC on the left side of the cell array CA. The gate electrodes 5 pulled out to the right side are controlled by the word line controller WC on the right side of the cell array CA. The insulating gates 5b are also pulled out to the right or left side of the cell array CA. In the word line controller WC, a gate electrode 12 is formed on the substrate 1 in the active region 2, through a gate insulating film (not shown).

In the cell array CA, a bottom contact 14 brought into contact with the low-resistance layer 10 on the drain region 9D is formed. An MTJ element 15 is formed on the bottom contact 14. The MTJ element 15 is configured to take a stationary resistive state varying in accordance with a direction of a current flowing through the element. A phenomenon indicating resistance varying in accordance with the state is called a magnetoresistive effect, and the MTJ element maintains data by using the effect. The MTJ element 15 comprises at least, a fixed layer, a recording layer and an insulating layer therebetween. In the fixed layer, the magnetization is fixed. The recording layer has the magnetization varying in accordance with a direction of a write current flowing through the layer. The MTJ element 15 indicates different resistive states, depending on a relative relationship between a direction of the magnetization in the fixed layer and a direction of the magnetization in the recording layer. Each of the different resistive states is related with, for example, one of two binary values.

A top contact 16 is connected to a top surface of the MTJ element 15. A bit line 18 is formed on the top contact 16. A source contact 20 is connected to the source region 9S. A source line 22 is formed on the source contact 20. The bit line 18 and the source line 22 are positioned in the M0 interconnect layer, extend in the Y-direction, and alternately align in the X-direction. The bit line 18 and the source line 22 are formed by, for example, SPT.

In the boundary region BAW, a bottom contact 24 is connected to each of the gate electrodes 5a. The bottom contact 24 is formed in the same process as the bottom contact 14 and, typically, has the same height as the bottom contact 14. A top contact 25 is formed on the bottom contact 24. The top contact 25 is formed in the same process as the top contact 16, and reaches the M0 interconnect layer from the bottom contact 24. The bottom contact 24 is connected with an interconnect 26. The interconnect 26 is positioned in the M0 interconnect layer. The interconnect 26 reaches the word line controller WC where the interconnect 26 is connected to a source/drain region 34 of a transistor constituting a part of the word line controller WC, through contacts 31 and 32 stacked on the substrate 1. The transistor comprises the gate electrode 12.

In the boundary region BAW, a contact 28 is connected to the insulating gate 5b. The contact 28 is formed in the same process as the source contact 20, and reaches the M0 interconnect layer. The contact 28 is connected to an interconnect 29. The interconnect 29 is positioned in the M0 interconnect layer. For example, the contact 28 is positioned at coordinates different from coordinates of the source contact 20, in the Y direction. In other words, the contact 28 is displaced from extension of a row of the source contact 20 in the X-direction. A region where elements are not formed is embedded by an interlayer insulating film (not shown), in (b), (c), (d) and (e) of FIG. 5.

The structure of the cell array CA is not limited to the structure shown in FIG. 5. For example, structures shown in FIG. 6 to FIG. 8 can be adopted. FIG. 6 to FIG. 8 show a partial structure of the memory device according to a second example of the first embodiment. FIG. 6 to FIG. 8 illustrate variations corresponding to a cross section in (b) of FIG. 5. In an example of FIG. 6, the element isolating/insulating film 4 is disposed instead of the insulating gate 5b. The pair of cell transistors are electrically isolated from each other by the element isolating/insulating film 4. In an example of FIG. 7, cell transistors adjacent in a lateral direction in FIG. 7 do not share the source region 9S. In other words, each of the cell transistors comprises the source region 9S for itself, and each source region 9S comprises an exclusive source contact 20. Transistors (word lines 5a) aligned in the lateral direction in FIG. 7 are electrically isolated from each other by the insulating gate 5b disposed therebetween. Thus, the word lines 5a and the insulating gates 5b are alternately aligned in the lateral direction in FIG. 7. In an example of FIG. 8, the element isolating/insulating films 4 are disposed instead of the insulating gates 5b in the example of FIG. 7. Each of the element isolating/insulating films 4 electrically isolates the transistors (word lines 5a) from each other on both sides thereof. The following descriptions and drawings include the cell array CA of the structure shown in FIG. 5 but may include the cell arrays CA of the structures shown in FIG. 6 to FIG. 8.

A manufacturing process of the memory device shown in FIG. 5 will be described with reference to FIG. 9 to FIG. 15. FIG. 9 to FIG. 15 show states in the process of manufacturing the structure shown in FIG. 5, in order. In each of FIG. 9 to FIG. 15, (a), (b), (c), and (d) illustrate steps of manufacturing the structure in (a), (b), (c) and (d) of FIG. 5, respectively.

Figure 9:
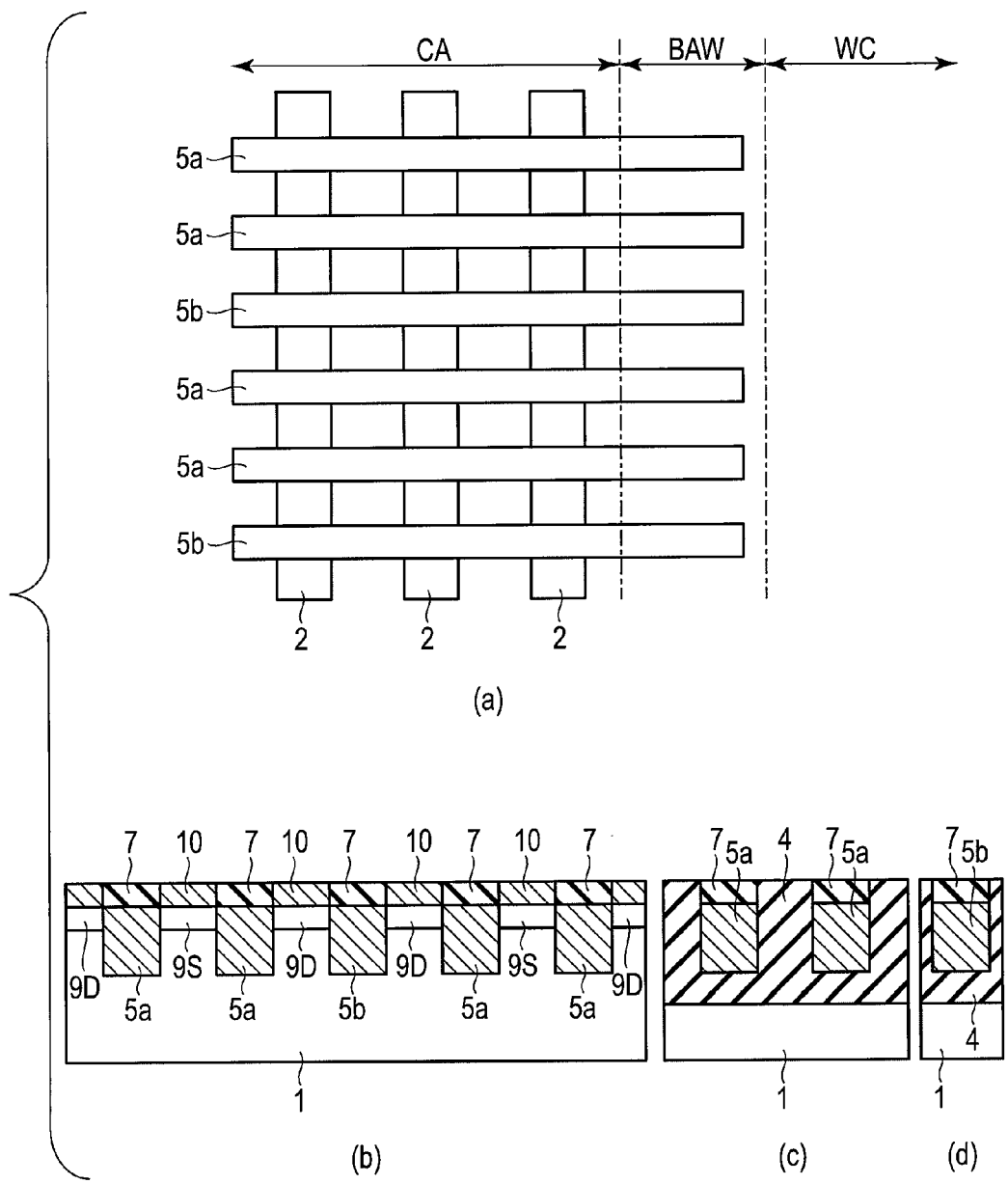
FIG. 9 shows a state in a manufacturing process of the magnetic memory device according to the first embodiment.

As shown in FIG. 9, the active region 2 is formed on the surface of the substrate 1 by ion implantation process and diffusion process. Next, a trench for the element isolating/insulating film 4 is formed by a lithography process and etching, the insulating film is embedded in the trench, and the element isolating/insulating film 4 is thereby formed. Then, trenches for the gate electrodes 5 (5a, 5b) are formed by a lithography process and etching, the gate insulating film is formed on the surfaces of the trenches, a conductive material is embedded in the suitable position between the top and bottom in the trenches, and the gate electrodes 5 are thereby formed. Then, the insulating film 7 is further embedded in the trenches. Then, the source/drain regions 9 (9S, 9D) are formed by ion implantation process and diffusion process, and the low-resistance layer 10 is formed. The gate insulating film, the gate electrode 12, and the source/drain region 34 are formed in the word line controller WC, during these steps.

Figure 10:
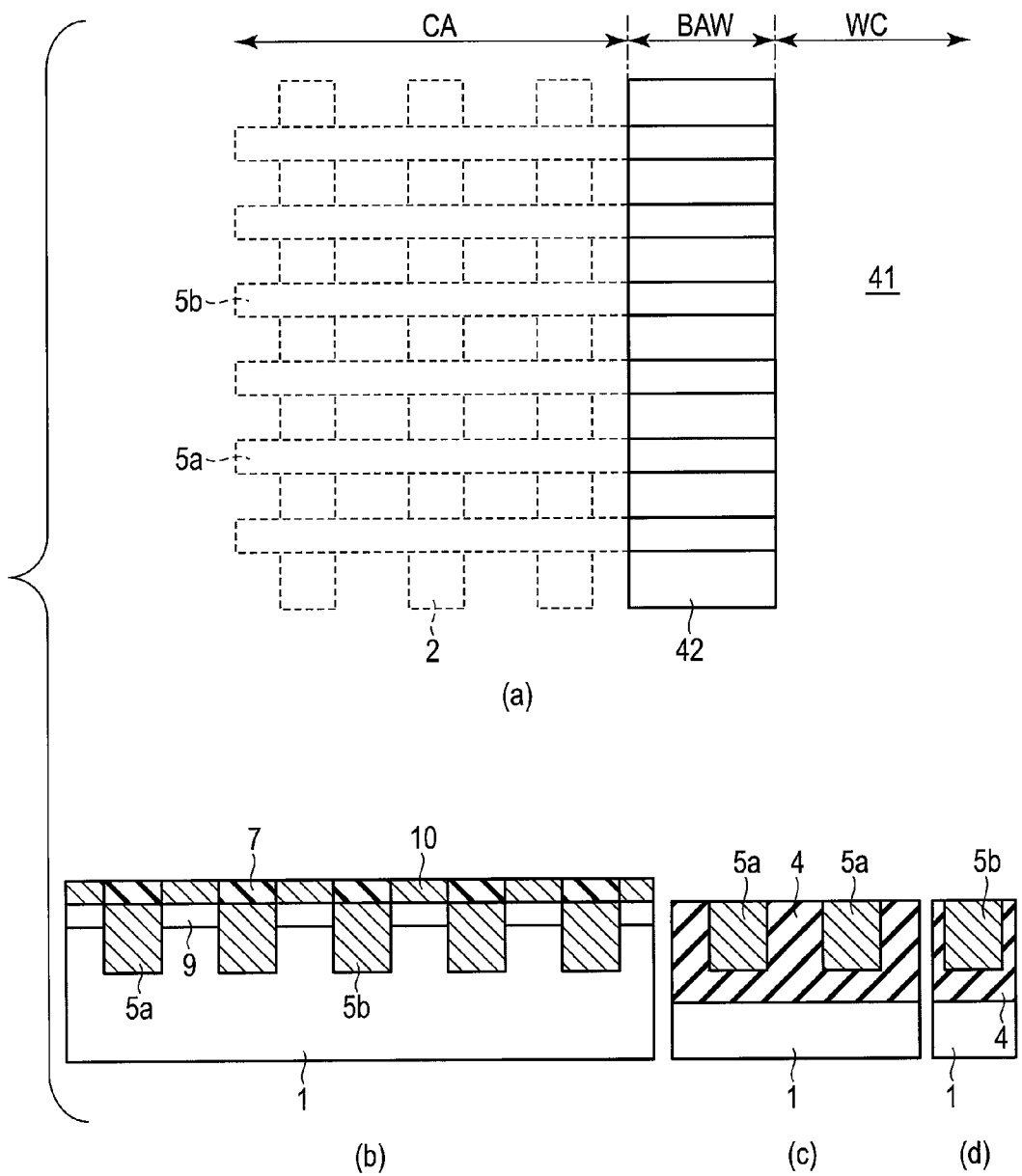
FIG. 10 shows a state subsequent to FIG. 9.

Next, a mask 41 is formed on the substrate 1 by a lithography process, as shown in FIG. 10. The mask 41 comprises openings 42 above the boundary region BAW. The openings 42 are positioned above the gate electrodes 5a and 5b (insulating film 7) in, at least, the boundary region BAW, and may extend to a top surface of the element isolating/insulating film 4 in the boundary region BAW. Furthermore, the openings 42 may be positioned above the entire boundary region BAW. Each of the drawings of the first embodiment illustrates the example in which the openings 42 are positioned above the gate electrodes 5 and the element isolating/insulating film 4. Then, the insulating film 7 and the element isolating/insulating film 4 in the openings 42 are removed by etching using the mask 41. As a result of the removal, the gate electrodes 5a and 5b are exposed in the boundary region BAW.

Figure 11:
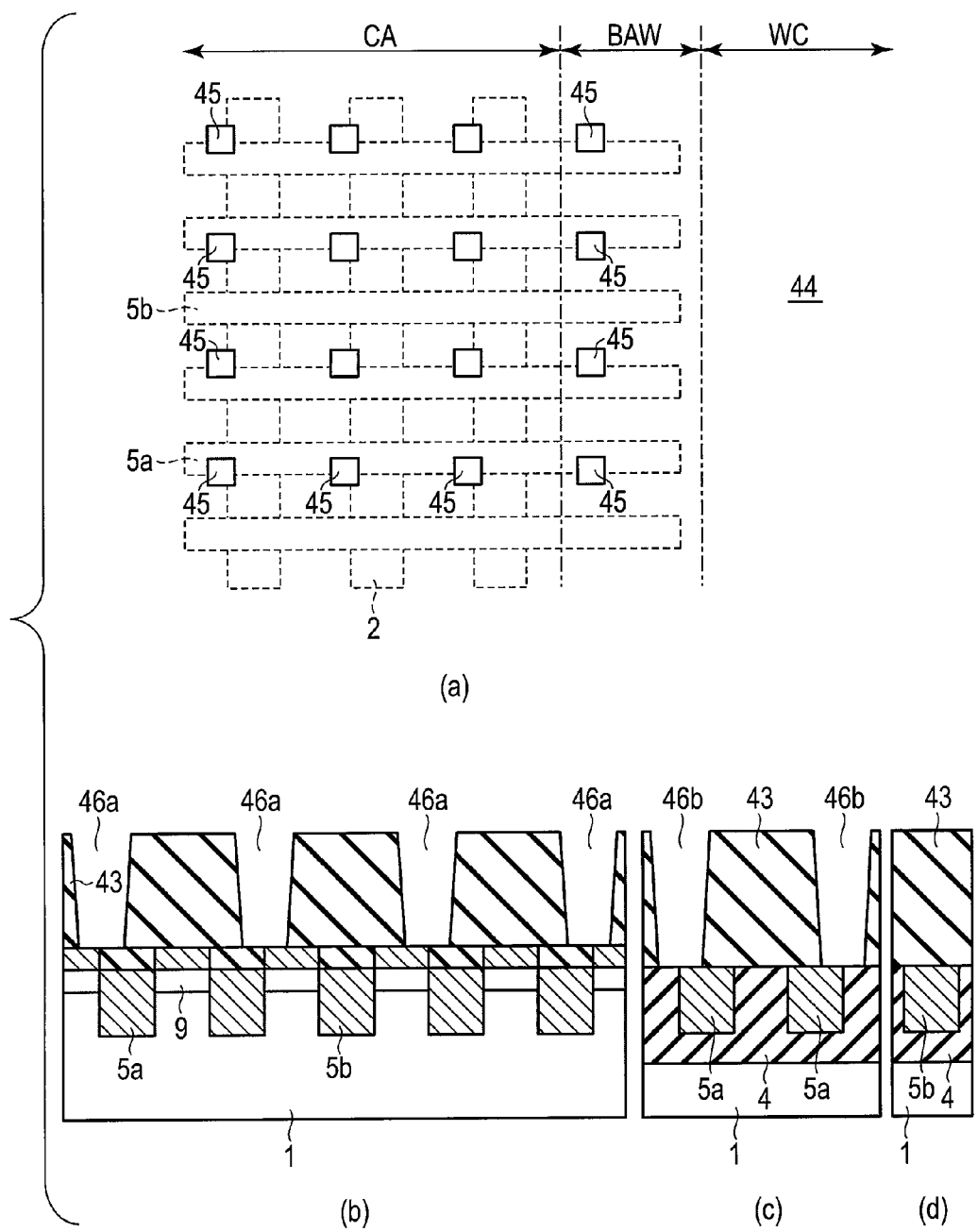
FIG. 11 shows a state subsequent to FIG. 10.

Next, an interlayer insulating film 43 is formed, and a mask 44 is formed on the interlayer insulating film 43 by a lithography process, as shown in FIG. 11. The mask 44 comprises openings 45 above a region where the bottom contacts 14 and 24 are to be formed. Then, contact holes 46a and 46b for the bottom contacts 14 and 24 are formed in the interlayer insulating film 43, by etching using the mask 44. The formation of the contact holes 46a and 46b is executed in the same steps, i.e., by using the single mask 44. Since the insulating film 7 is removed in the boundary region BAW, contact holes 46a reach the gate electrodes 5a. On the other hand, the contact holes 46b stop on the insulating film 7, in the cell array CA.

The formation of the contact holes 46a and 46b is executed in the same steps. For this reason, a space to remove a defect which would occur when the mask for formation of the contact holes 46a in the cell array CA is displaced from the mask for formation of the contact holes 46b in the boundary region BAW, is unnecessary. The first embodiment requires arrangement of the mask 41 to remove the insulating film 7 in the boundary region BAW, and the mask displacement could occur. However, positioning accuracy required of the mask 41 is more relaxed than accuracy of positioning the mask for formation of the contact 109 in the methods shown in FIG. 2 and FIG. 3. The reason is that a number of elements are not formed in the cell array CA at the removal of the insulating film 7, that the position of the mask for the insulating film 7 gives no influences to the position of the bottom contacts 24 and the positions of the bottom contacts 24 are determined by the mask 44 in the step shown in FIG. 12, etc.

In addition, the openings 45 are regularly aligned at the mask 44 for formation of the contact holes 46. For this reason, the bottom contacts 24 conform to the rule of alignment of the bottom contacts 14. In other words, the bottom contacts 24 are positioned in extension of the rows of the bottom contacts 14, and can be formed with the same pitch as the pitch of the bottom contacts 14. Elements to be formed with higher regularity can be formed more easily with higher accuracy. For this reason, including the bottom contacts 24 in the regular alignment of the bottom contacts 14 decrease difficulty and improve completion in the formation of the bottom contacts 24.

Next, a conductive material is embedded in the contact holes 46a and 46b, and the bottom contacts 14 and 24 are formed, as shown in FIG. 12.

Figure 13:
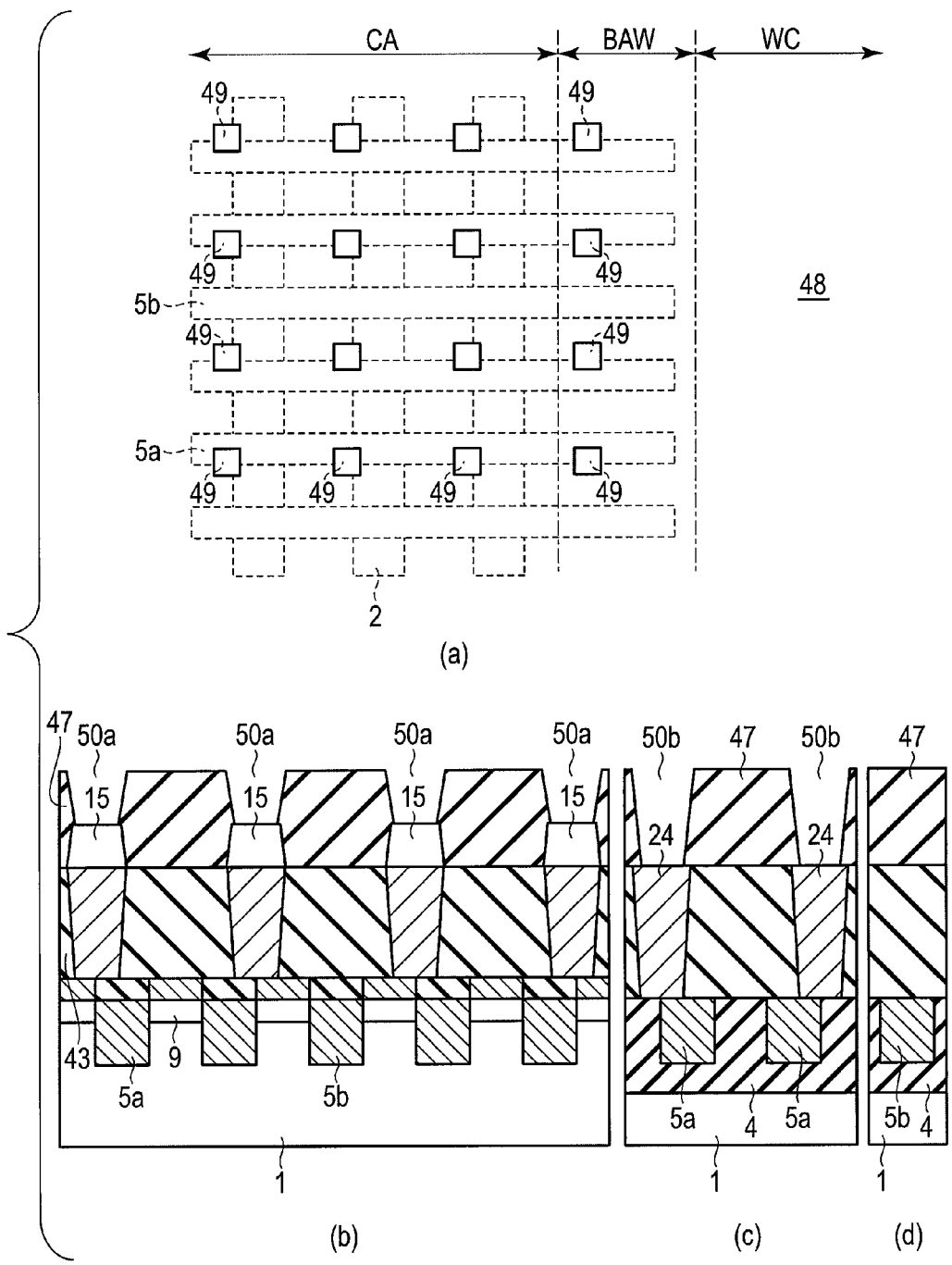
FIG. 13 shows a state subsequent to FIG. 12.

Next, the MTJ elements 15 are formed on the bottom contacts 14, and an interlayer insulating film 47 is formed on the interlayer insulating film 43, by a lithography process and etching, as shown in FIG. 13. Then, a mask 48 is formed on the interlayer insulating film 47 by a lithography process. The mask 48 comprises openings 49 above a region where the top contacts 16 and 25 are to be formed. Then, contact holes 50a and 50b for the top contacts 16 and 25 are formed in the interlayer insulating film 47 by etching using the mask 48. The formation of the contact holes 50a and 50b is executed in the same steps, i.e., by using the single mask 48. The contact holes 50a need to stop on top surfaces of the MTJ elements 15 and contact holes 50b need to reach the bottom contact 24. For this purpose, the etching is controlled such that the contact holes 50b reach the bottom contacts 24, at a depth deeper than the depth at which the contact holes 50a reach the MTJ elements 15. On the other hand, the MTJ elements 15 comprises, for example, an etching stopper film on their top surfaces to prevent characteristics of the MTJ elements 15 from being damaged by the etching.

Figure 14:
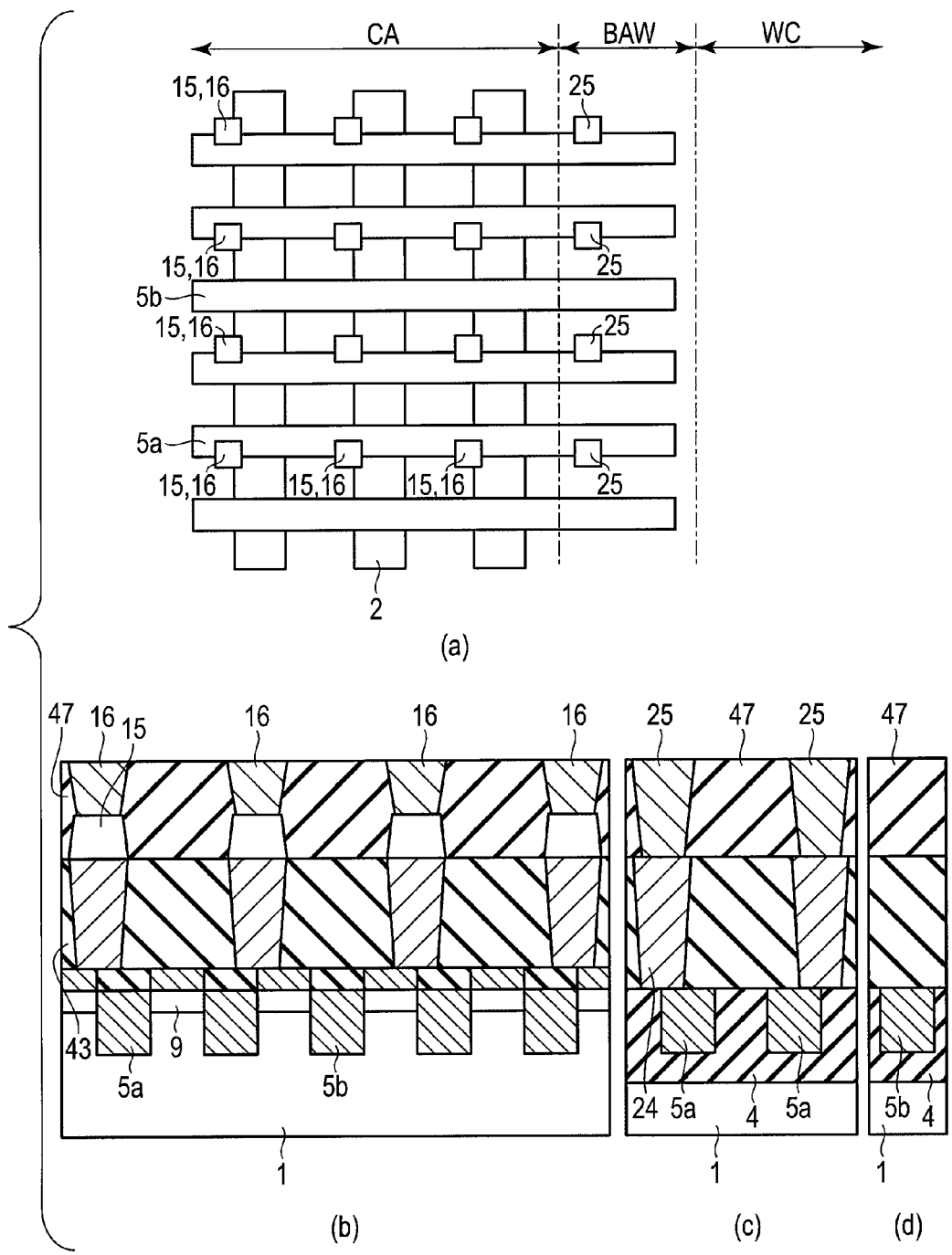
FIG. 14 shows a state subsequent to FIG. 13.

Next, a conductive material is embedded in the contact holes 50a and 50b, and the top contacts 16 and 25 are formed as shown in FIG. 14.

Figure 15:
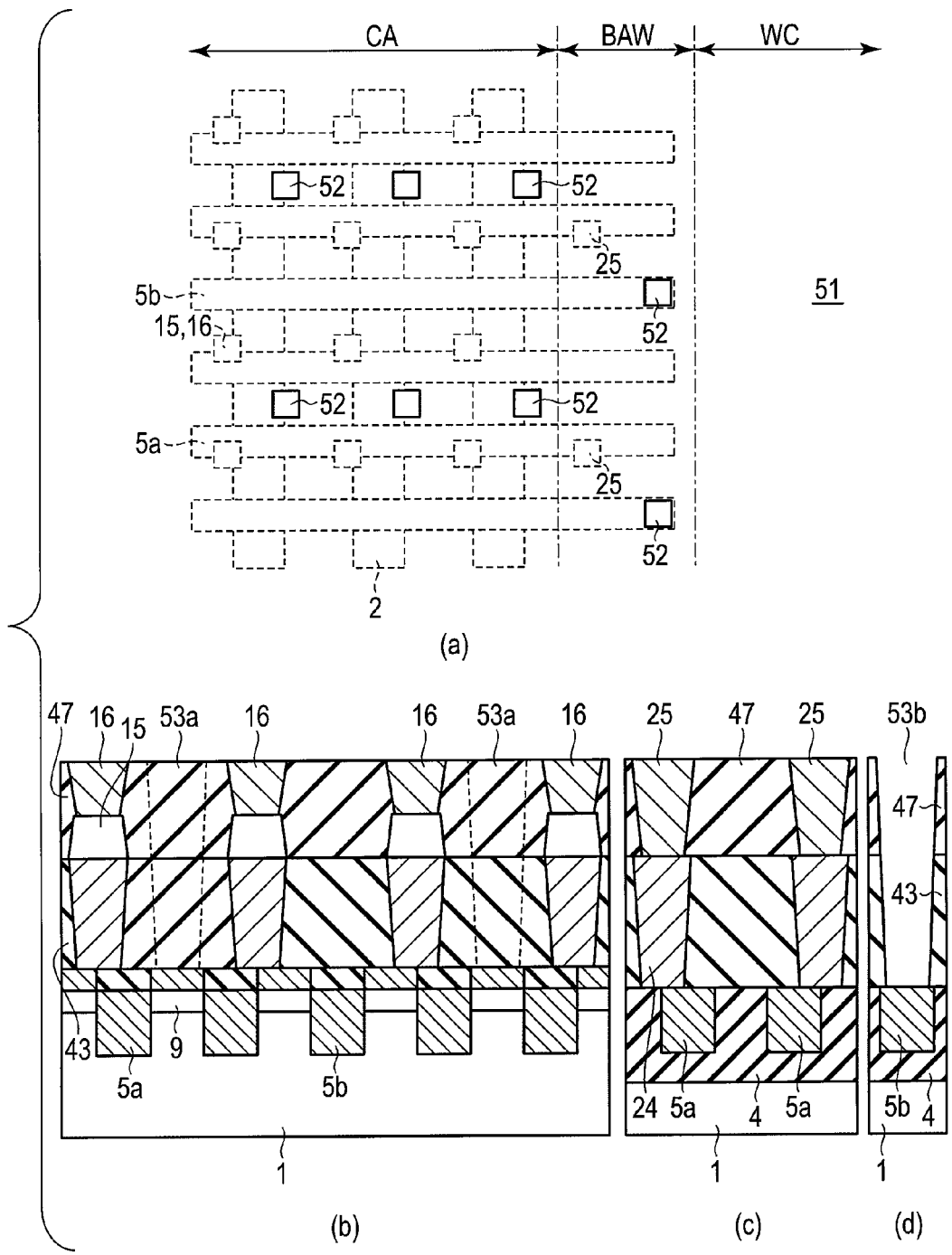
FIG. 15 shows a state subsequent to FIG. 14.

Next, a mask 51 is formed on the interlayer insulating film 47 by a lithography process as shown in FIG. 15. The mask 51 comprises openings 52 above a region where the source contacts 20 and the contacts 28 are to be formed. Then, contact holes 53a and 53b for the contacts 20 and 28 are formed in the interlayer insulating films 43 and 47 by etching using the mask 51. The formation of the contact holes 53a and 53b is executed in the same steps, i.e., by using the single mask 51.

Next, a conductive material is embedded in the contact holes 53a and 53b and the source contacts 20 and the contacts 28 are formed as shown in FIG. 5. The contacts 31 and 32 are formed in the word line controller WC, at an arbitrary step of the current process. For example, the contact 31 is formed by a lithography process and etching in a step between the step shown in FIG. 12 and the step shown in FIG. 13, and the contact 32 is formed after the formation of the MTJ elements 15 in FIG. 14.

Figure 16:
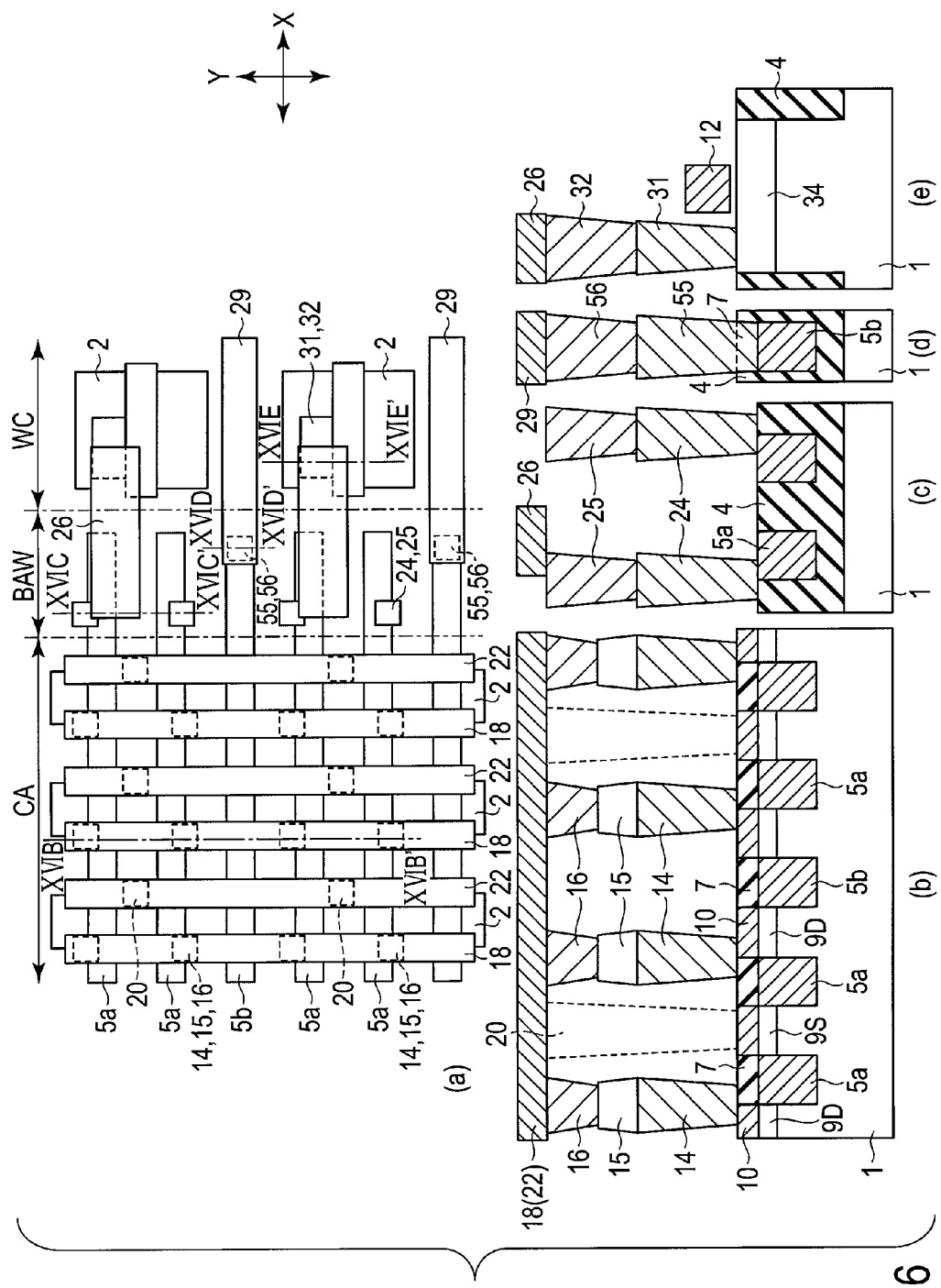
FIG. 16 shows a structure of a part of the magnetic memory device according to a third example of the first embodiment.

Next, trenches for the bit lines 18, source lines 22, and the interconnects 26 and 29 are formed in an interlayer insulating film (not shown) by a lithography process and etching, a conductive material is embedded in the trenches, and the bit lines 18, source lines 22, and the interconnects 26 and 29 are formed. The formation of the contacts 28 in the boundary region BAW may be the same process as the source contacts 20 in the cell array CA, and may be an another process. For example, the structure in which the contacts 28 and the source contacts 20 are different in coordinates in the Y direction as shown in FIG. 5 is often difficult for reasons such as the manufacturing of the mask 51, and the control of the etching conditions. In such a case, the contacts 28 may be formed in steps different from the source contacts 20. FIG. 16 shows such a case, illustrating a structure of a part of a memory device according to a third example of the first embodiment, i.e., the boundary region BAW and a periphery of the region. In FIG. 16, similarly to FIG. 5, (a) illustrates the layout of the boundary region BAW and the periphery of the region, and (b), (c), (d) and (e) illustrate cross sections seen along lines XVIB-XVIB', XVIC-XVIC', XVID-XVID' and XVIE-XVIE' in (a), respectively.

The insulating gate 5b in the boundary region BAW is connected with the interconnect 26 by contacts 55 and 56 as shown in FIG. 16. The contact 55 is connected with the insulating gate 5b, and the contact 56 connects the contact 55 with the interconnect 29.

Figure 17:
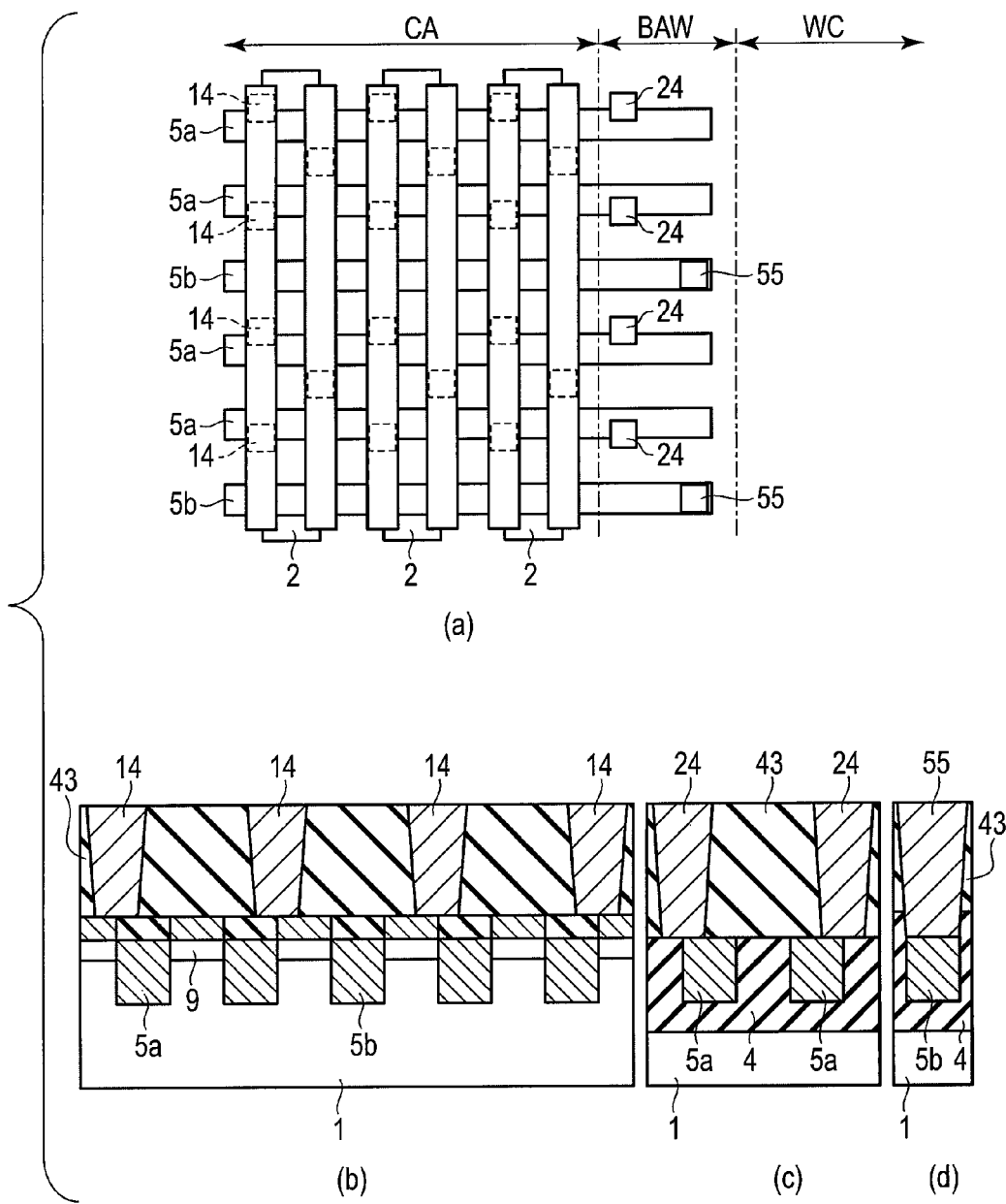
FIG. 17 shows a state in a manufacturing process of the magnetic memory device according to the third example of the first embodiment.

FIG. 17 to FIG. 18 sequentially show states of the structure shown in FIG. 16 in a manufacturing process. In each of FIG. 17 and FIG. 18, (a), (b), (c) and (d) illustrate the structure manufacturing steps in (a), (b), (c) and (d) in FIG. 16, respectively.

First, the steps shown in FIG. 9 and FIG. 10 are executed. However, the insulating film 7 may be removed as shown in FIG. 10 or may not be removed in the region where the contacts 55 are to be formed in the boundary region BAW. FIG. 16 to FIG. 18 show an example in which the film is not removed.

Next, the bottom contacts 14 and 24 are formed in the steps described with reference to FIG. 11 and FIG. 12, as shown in FIG. 17. Then, contact holes (not shown) for the contacts 55 are formed in the interlayer insulating film 43 by a lithography process and etching, a conductive material is embedded in the contact holes, and the contacts 55 are formed. The etching conditions are controlled such that the contact holes for the contacts 55 reach the insulating gates 5b, based on whether the insulating film 7 exists on the insulating gates 5b or not. The formation of the contacts 55 is executed in the same steps as the steps of the formation of, for example, the bottom contacts 31 in the word line controller WC. The contacts 55 may be formed prior to the formation of the bottom contacts 14 and 24.

Next, the MTJ elements 15, and the top contacts 16 and 25 are formed in the steps described with reference to FIG. 13 and FIG. 14, as shown in FIG. 18. Then, contact holes for the contacts 56 are formed in the interlayer insulating film 47 (not shown) by a lithography process and etching, a conductive material is embedded in the contact holes, and the contacts 56 are formed, as shown in FIG. 16. The contacts 56 are formed in the same steps as the steps of the formation of, for example, the top contacts 32 in the word line controller WC. Then, the bit lines 18, source lines 22, and the interconnects 26 and 29 are formed in the steps described with reference to FIG. 5.

As described above, the memory device of the first embodiment enables the bottom contacts 24 to be formed in the same steps as the bottom contacts 14. For this reason, it is unnecessary to keep the margin of region for displacement of the mask for the formation of the contact holes 46a and the mask for the formation of the contact holes 46b. Furthermore, the pitches of the bottom contacts 14 and 24 can be made equal. It means that a width of the boundary region BAW (i.e., an interval between the cell array CA and the word line controller WC) is reduced. Therefore, the number of chips per wafer can be increased and reduction of the manufacturing costs of the memory device can be implemented. In addition, the first embodiment also enables the contacts 28 to be formed in the same steps as the source contacts 20. This means that the margin of region is unnecessary, and the width of the boundary region BAW is thereby reduced.

Second Embodiment

Second embodiment relates to a boundary region BAB between a cell array CA and a bit line/source line controller BSC.

FIG. 19 shows a structure of a part of a memory device according to the second embodiment, illustrating a boundary region BAB between a cell array CA and a bit line/source line controller BSC and a periphery of the region. In FIG. 19, (a) illustrates a layout of the boundary region BAB and the periphery of the region. However, it should be noted that the layout in FIG. 1 is rotated at 90 degrees in FIG. 19(a). In FIG. 19, (b) and (c) illustrate cross sections seen along lines XIXB-XIXB' and XIXC-XIXC'.

As shown in FIG. 19, elements in the bit line/source line controller BSC are formed in a common process to a process of elements in the cell array CA. In other words, a gate electrode 5 is formed near a surface of the substrate 1, and an insulating film 7 is formed on the gate electrode 5, in the bit line/source line controller BSC. A source/drain region 9 is formed beside the gate electrode 5, and the source/drain region 9 is covered with a low-resistance layer 10. The type of transistor in the bit line/source line controller BSC is not limited to a transistor of an embedded type (i.e., a type comprising the gate electrodes 5 and the source/drain regions 9 as shown in FIG. 5) similarly to a transistor in the cell array CA, but may be of, for example, a so-called a planar type. The same structure as the structure of the transistor in the word line controller WC as shown in FIG. 5(e) can be employed as the structure of the planar type transistor.

A set of bit lines 18 reach an inside of one of bit line/source line controllers BSC on the upper side of the cell array CA, from one of an upper end and a lower end (for example, upper end) of each cell array CA shown in FIG. 1, and a set of source lines 22 reach an inside of one of bit line/source line controllers BSC on the upper side of the cell array CA, from the other (for example, lower end) of each cell array CA. This is because bit lines 18 and source lines 22 become capable of being connected by the bit line/source line controller BSC and the bit line/source line controller BSC becomes capable of controlling electric potentials of the bit lines 18 and source lines 22. FIG. 19 illustrates a boundary of a side on which the bit lines 18 of the cell array CA extend off. Thus, the bit lines 18 extend to an inside of the bit line/source line controller BSC where the bit lines 18 function as interconnects 61 in an M0 interconnect layer. On the side illustrated in FIG. 19, each of the source lines 22 faces an interconnect 62 extending along an extension of the source line 22, in the boundary region BAB. The interconnect 62 exists in the M0 interconnect layer, and is formed by partitioning the same interconnect structure as the source lines 22 as described later. On a side opposite to the side shown in FIG. 19, of the cell array CA, each of the bit lines 18 faces an interconnect 61 extending along the extension of the bit line 18, in the boundary region BAB, and each of the source lines 22 extends to an inside of the bit line/source line controller BSC, and functions as an interconnect 62. The interconnects 61 and 62 may be formed by double patterning, similarly to the sets of bit lines 18 and source lines 22 or may be formed in a general process (i.e., non-double patterning). The interconnects 61 and 62 are connected to a source/drain region 9 by bottom contacts 64 on a substrate 1 and top contacts 65 formed thereon. The bottom contacts 64 and the top contacts 65 are formed in the same steps as the bottom contacts 14 and the top contacts 16, respectively. In (b) and (c) of FIG. 19, a region where elements are not formed is embedded by an interlayer insulating film (not shown).

Figure 20:
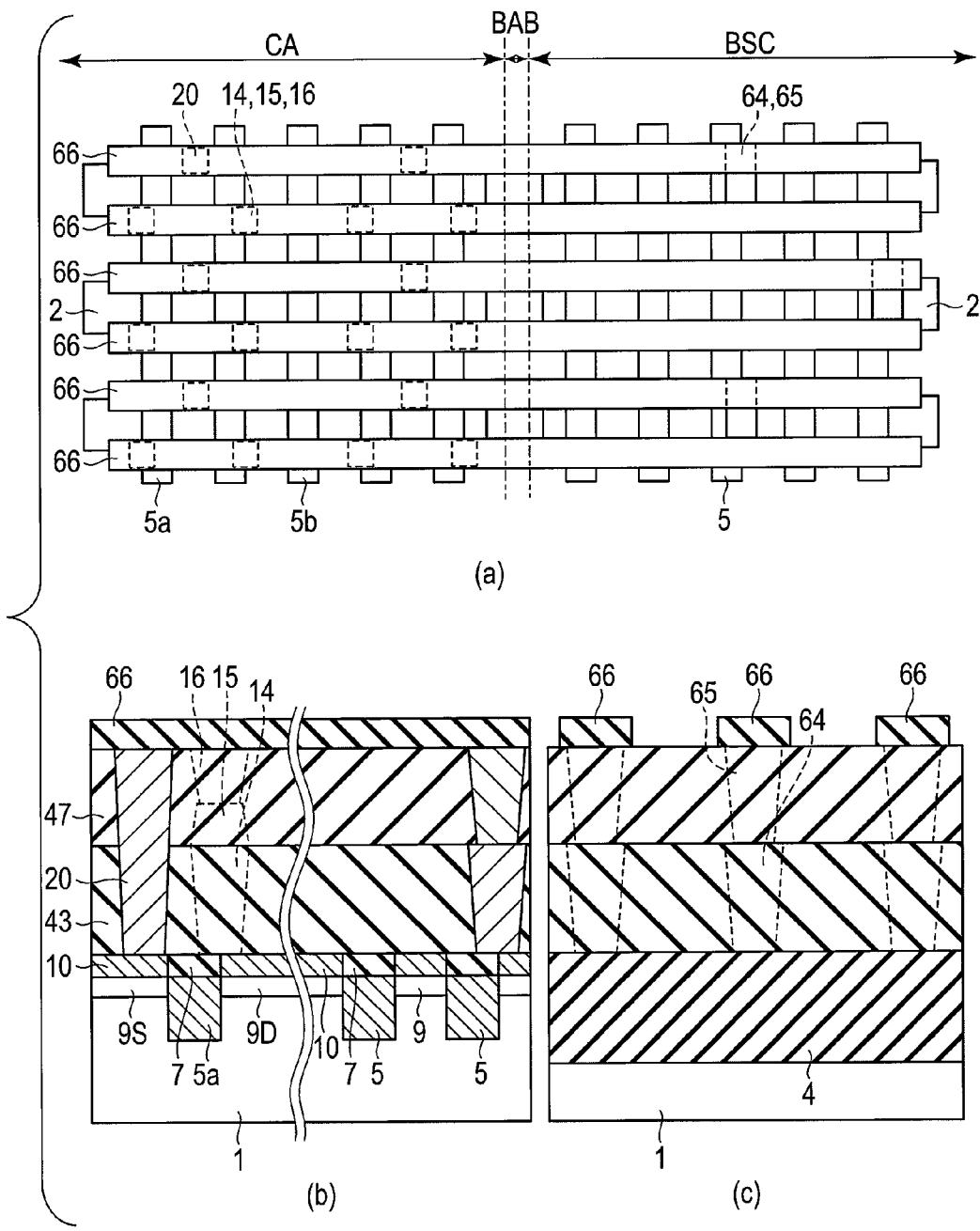
FIG. 20 shows a state in a manufacturing process of the magnetic memory device according to the second embodiment.
Figure 21:
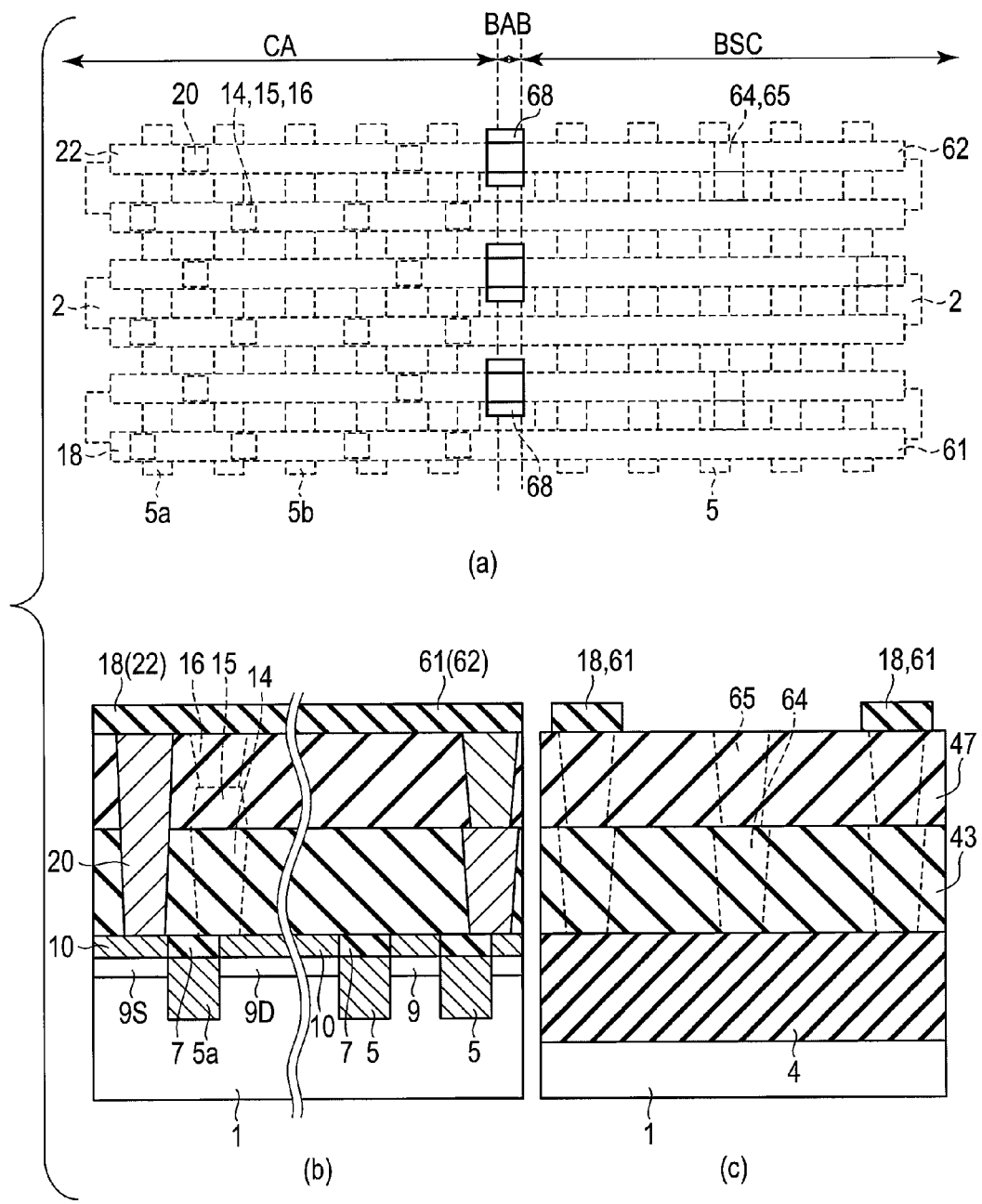
FIG. 21 shows a state subsequent to FIG. 20.

FIG. 20 to FIG. 21 sequentially show states of the structure shown in FIG. 19 in a manufacturing process. In each of FIG. 20 and FIG. 21, (a), (b), and (c) illustrate the structure manufacturing steps in (a), (b), and (c) in FIG. 19, respectively.

As shown in FIG. 20, active regions 2, element isolating/insulating film 4, gate electrodes 5, an insulating film 7, source/drain regions 9, and a low-resistance layer 9 are formed in the cell array CA and the bit line/source line controller BSC, in the steps described with reference to FIG. 9. The second embodiment can be combined with the first embodiment. If the second embodiment is combined with the first embodiment, the insulating film 7 and, optionally, the element isolating/insulating film 4 are removed in the boundary region BAW, in the steps described with reference to FIG. 10.

Next, bottom contacts 14 are formed in the cell array CA and the bit line/source line controller BSC, MTJ elements 15 are formed in the cell array CA, and top contacts 16 are formed in the cell array CA, in the steps described with reference to FIG. 11 to FIG. 14. In the steps of forming the bottom contacts 14 and the top contacts 16, the bottom contacts 64 and the top contacts 65 are also formed concurrently. Then, source contacts 20 are formed in the cell array CA and the bit line/source line controller BSC, in the steps described with reference to FIG. 1.

Next, an interconnect pattern 66 is formed on the M0 interconnect layer in the steps described for the bit lines 18, the source lines 22, and the interconnects 26 and 29 with reference to FIG. 5, as shown in FIG. 20. The interconnect pattern 66 is processed later to be the bit lines 18, the source lines 22, or the interconnects 61 and 62 and formed as, for example, lines and spaces of a minimum pitch.

Next, a mask 67 is formed on the interconnect pattern 66 by a photolithography process or the like, as shown in FIG. 21. The mask 67 comprises openings 68 in a region where the bit lines 18 or the source lines 22 in the boundary region BAB are to face the interconnects 61 or 62. In other words, the openings 68 are formed above the respective source lines 22, in the boundary region BAB of a side on which the bit lines 18 extend off, of the cell array CA, as shown in FIG. 21. On the other hand, the openings 68 are formed above the respective bit lines 18, in the boundary region BAB of a side on which the source lines 22 extend off, of the cell array CA. Then, the interconnect pattern 66 is partitioned by etching using the mask 67. As a result, the interconnect pattern 66 is partitioned to sets of source lines 22 and interconnects 62 or sets of bit lines 18 and interconnects 61. The structure shown in FIG. 19 is thus formed.

Figure 24:
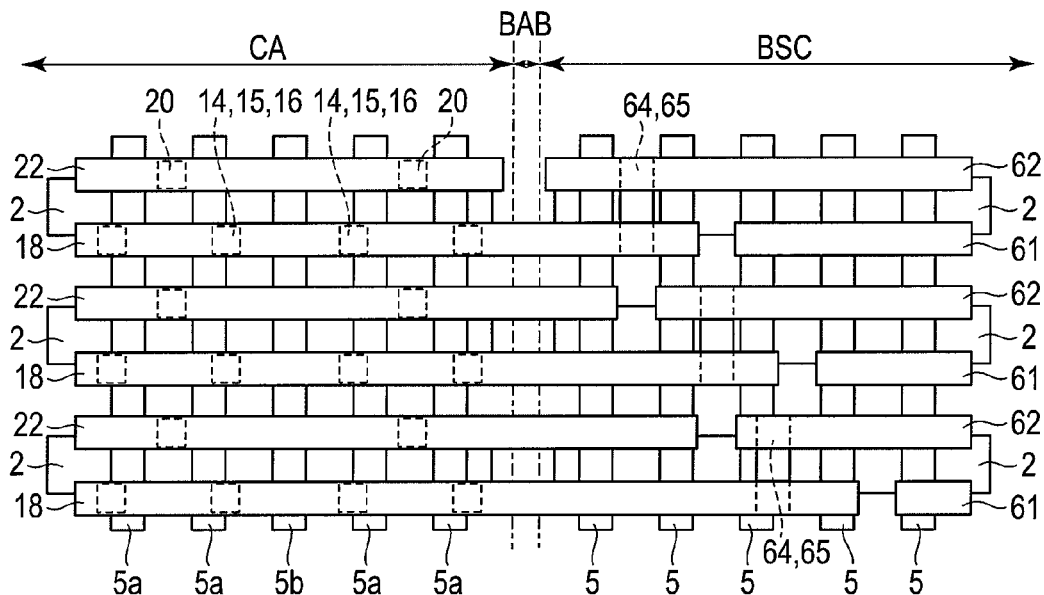
FIG. 24 shows a structure of a part of the magnetic memory device according to a fourth example of the second embodiment.
Figure 25:
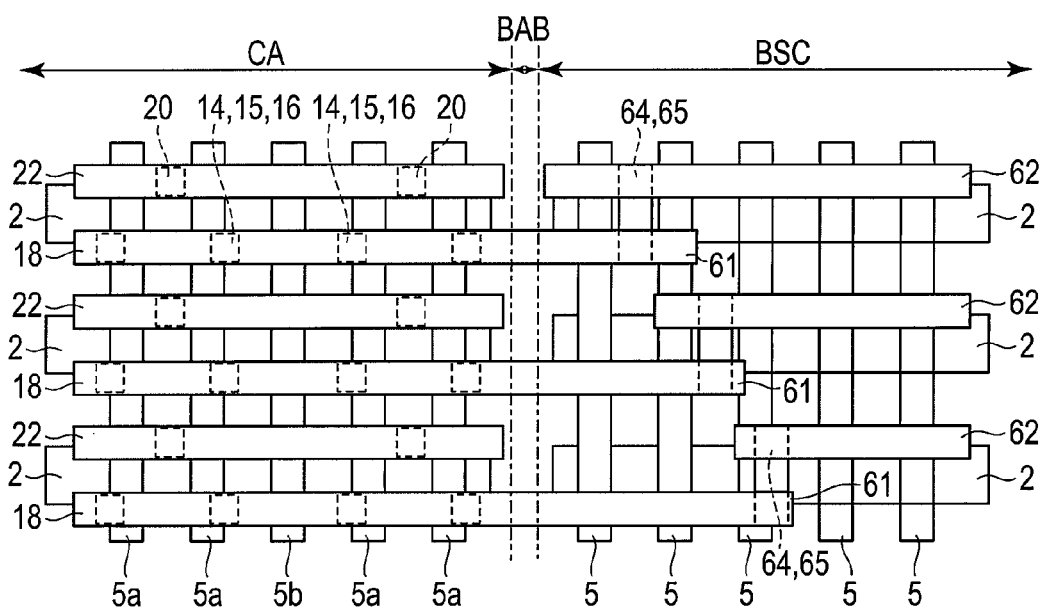
FIG. 25 shows a structure of a part of the magnetic memory device according to a fifth example of the second embodiment.

Partitioned portions of the interconnect pattern 66 are not limited to positions shown in FIG. 19. FIG. 22 to FIG. 25 show structures of parts of second to fifth examples of the second embodiment. The partitioned portions may be in the bit line/source line controller BSC as shown in FIG. 22 to FIG. 25. In addition, an area of each partitioned portion may extend as shown in FIG. 23. In other words, the partitioned portions reach the boundary region BAB from vicinities of the contacts 64 and 65 as shown in FIG. 22. Furthermore, besides the partition shown in FIG. 22, the bit lines 18 and the interconnects 61 are also partitioned as shown in FIG. 24. In other words, the bit lines 18 extend to the inside of the bit line/source line controller BSC and face the interconnects 61, separately from the interconnects, behind intersections between the interconnects 61 and the contacts 64 and 65. Moreover, the bit lines 18 reach the inside of the bit line/source line controller BSC, function as the interconnects 61, and are connected with the contacts 65, as shown in FIG. 25. The interconnects 61 are not provided beyond intersections between the interconnects 61 (bit lines 18) and the contacts 65.

When the interconnect pattern 66 is formed by SPT, the bit lines 18, the source lines 22, and the interconnects 61 and 62 can be formed in steps described below. FIG. 26 to FIG. 29 sequentially show states of the structure shown in FIG. 19 in the manufacturing process of the second example. Each of FIG. 26 to FIG. 29 illustrates a manufacturing step of the structure in FIG. 19(c).

First, the steps described with reference to FIG. 1 are executed through the process in FIG. 15, the source contacts 20 and the top contacts 65 are formed, and the steps are continued to the step in FIG. 26. An insulating film 71 is formed on the interlayer insulating film 47 and an insulating film 73 is formed on the insulating film 71, as shown in FIG. 26. The insulating film 73 comprises a line-and-space pattern, and has a minimum size in which the film can be formed by a lithography process.

Next, a line pattern of the insulating film 73 is further narrowed by, for example, etching, as shown in FIG. 27. Next, an insulating film 75 is deposited on side walls of a line pattern 73 (i.e., a line pattern of the insulating film 73).

Next, the line pattern 73 is removed by etching as shown in FIG. 28. Then, the insulating film 71 is etched by using the pattern of the insulating film 75 as a mask. As a result, the pattern of the insulating film 75 is transferred to the insulating film 71. Spaces (trenches) 77 in the insulating film 71 correspond to the region where the interconnect pattern 66 (bit lines 18, source lines 22, and interconnects 61 and 62) is formed. Then, the insulating film 75 is removed.

Next, an insulating film 78 is embedded in the region where the interconnect pattern 66 is partitioned, in the trenches 77, by a lithography process and etching, as shown in FIG. 29. Then, the conductive material of the bit lines 18, the source lines 22, and the interconnects 61 and 62 is embedded in the trenches 77. As a result, the bit lines 18, the source lines 22, and the interconnects 61 and 62 are formed as shown in FIG. 19. Each of the elements (i.e., the bit lines 18, the source lines 22, the interconnects 61 and 62, etc.) thus formed by SPT and damascene process has a reverse-tapered cross section (not shown).

As described above, in the memory device of the second embodiment, the interconnect pattern 66 extending from the cell array CA to the bit line/source line controller BSC is formed, and the bit lines 18, the source lines 22, and the interconnects 61 and 62 are formed by partitioning the interconnect pattern 66. For this reason, the structure for connection between the bit lines 18 and the interconnects 61 and connection between the source lines 22 and the interconnects 62 in the boundary region BAB (i.e., the structure in the boundary region 111 in FIG. 4) is unnecessary. It means that the width of the boundary region BAB (i.e. the interval between the cell array CA and the bit line/source line controller BSC) is reduced. When the interconnect pattern 66 is formed by the SPT, a space for preparation of loop-cut in the boundary region BAB is unnecessary. This is because the interconnect pattern 66 extends from the cell array CA to the bit line/source line controller BSC and the loop pattern is not positioned in the boundary region BAB. Therefore, the boundary region BAB can be further reduced, upon combination with the SPT.

The first embodiment and the second embodiment have been described while taking the MRAM as the example of the memory device. The embodiments can also be accomplished as other resistance change type memory comprising the same components as those described in the first and second embodiments, for example, an element used for PRAM or phase-change random access memory (PCRAM) or resistive random access memory (ReRAM). In addition, the first embodiment and the second embodiment have been described while taking the transistor using the gate electrode 5 as the example. However, the type of transistor may be a planar transistor or a FinFET transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a cell array region comprising:
- a plurality of transistors comprising a plurality of source/drain regions, the plurality of transistors sharing a word line among a plurality of word lines, the word lines having an embedded gate structure and extending from the cell array region to outside of the cell array region,
- a first insulating film on the word lines,
- a plurality of memory elements, and
- a plurality of first contacts configured to connect the plurality of transistors with the plurality of memory elements, respectively, and aligned with a pitch, the plurality of first contacts being in contact with the first insulating film and the plurality of source/drain regions; and
a plurality of second contacts which are aligned with the same pitch as the pitch of the plurality of first contacts, and are positioned along respective extensions of rows of the plurality of first contacts, outside the cell array region, and configured to be in contact with the respective word lines,
wherein a part of a lower surface of the respective second contacts is in contact with the corresponding word line.

2. The device of claim 1, further comprising a plurality of second insulating films to partition an active region,
wherein upper surfaces of the plurality of second insulating films on at least the part of the outside of the cell array region are lower than an upper surface of the first insulating film.

3. The device of claim 2, further comprising a controller region comprising a transistor for a controller configured to control the word lines,
wherein the second contacts are positioned between the cell array region and the controller region.

4. The device of claim 1, further comprising:
a plurality of interconnects in the cell array region;
a plurality of third contacts configured to connect the plurality of memory elements with the plurality of interconnects, respectively, in the cell array region; and
a plurality of fourth contacts connected with the second contacts and positioned with a pitch of the third contacts along respective extensions of rows of the third contacts outside the cell array region.

5. A memory device comprising:
a plurality of memory elements;
a cell array region comprising:
- a plurality of transistors, and
- a plurality of first interconnects comprising a plurality of bit lines connected with the plurality of memory elements directly or via contacts, and a plurality of source lines connected with the plurality of transistors via contacts; and
a plurality of second interconnects arranged outside the cell array region and aligned with a same pitch as the plurality of first interconnects,
wherein:
the plurality of bit lines, the plurality of source lines, and the plurality of second interconnects extend in a same direction, at a same height,
the plurality of bit lines or the plurality of source lines face the plurality of second interconnects, respectively, and
one of the bit lines of the plurality of first interconnects and one of the plurality of second interconnects constitute an interconnect.

6. The device of claim 5, wherein one of the source lines of the plurality of first interconnects and one of the plurality of second interconnects are derived from a same interconnect.

7. The device of claim 6, wherein:
the memory device comprises a controller region comprising a controller configured to control the plurality of first interconnects.

8. The device of claim 7, wherein one of the bit lines of the plurality of first interconnects and one of the plurality of second interconnects extend in the cell array region and the controller region.

9. The device of claim 1, wherein the plurality of first contacts are aligned with the pitch in a direction orthogonal to an extending direction of the word lines, the second contacts are positioned with the pitch in the direction orthogonal to the extending direction of the word lines, and the pitch of the plurality of first contacts is equal to the pitch of the second contacts in the direction orthogonal to the extending direction of the word lines.

10. The device of claim 1, wherein:
upper surfaces of the plurality of first contacts and upper surfaces of the plurality of second contacts are at a same height, and
the lower surfaces of the plurality of second contacts are lower than lower surfaces of the plurality of first contacts.

11. The device of claim 1, wherein the first insulating film includes an opening at least in a part of the outside of the cell array region.

* * * * *